US008380144B1

(12) United States Patent
Bai et al.

(10) Patent No.: US 8,380,144 B1
(45) Date of Patent: Feb. 19, 2013

(54) SYSTEMS AND METHODS FOR DIGITAL PREDISTORTION IN A DUAL BAND TRANSMITTER

(75) Inventors: Chunlong Bai, Kanata (CA); Bradley John Morris, Ottawa (CA)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 13/249,319

(22) Filed: Sep. 30, 2011

(51) Int. Cl.
*H04B 1/04* (2006.01)
*H04K 1/02* (2006.01)
(52) U.S. Cl. ..................... 455/114.3; 375/296
(58) Field of Classification Search ............... 455/114.3, 455/114.2, 91, 63.1, 67.13; 330/149, 151, 330/136; 375/295, 296, 297
See application file for complete search history.

(56) References Cited

U.S. PATENT DOCUMENTS

| 6,549,067 | B1 * | 4/2003 | Kenington ................... 330/52 |
| 6,999,523 | B2 * | 2/2006 | Posti ........................... 375/296 |
| 7,170,344 | B2 * | 1/2007 | Suzuki et al. ............... 330/149 |
| 7,183,847 | B2 * | 2/2007 | Suzuki et al. ............... 330/149 |
| 7,539,464 | B2 * | 5/2009 | Suzuki et al. ............. 455/114.3 |
| 7,634,238 | B2 * | 12/2009 | Suzuki et al. ............. 455/114.3 |
| 2010/0316157 | A1 | 12/2010 | Bassam et al. |
| 2012/0069931 | A1 * | 3/2012 | Gandhi et al. ............... 375/296 |
| 2012/0154038 | A1 * | 6/2012 | Kim et al. ................... 330/149 |

OTHER PUBLICATIONS

Cidronali, A. et al., "A new approach for concurrent dual-band IF digital predistortion: system design and analysis," Integrated Nonlinear Microwave and Millimetre-Wave Circuits, 2008. Workshop on INMMIC 2008, Nov. 2008, 4 pages.
Cidronali, A., "Dual-band power amplifiers for MiMAX and WCDMA applications," Target Day Programme 2007, Florence, Italy, Dec. 17, 2007, 51 pages.

* cited by examiner

*Primary Examiner* — Sonny Trinh
(74) *Attorney, Agent, or Firm* — Withrow & Terranova, PLLC

(57) ABSTRACT

Systems and methods for providing digital predistortion to compensate for a non-linearity of a power amplifier in a dual-band transmitter are disclosed. In one embodiment, a first baseband signal is tuned to a first intermediate frequency to provide a first intermediate frequency signal. Likewise, a second baseband signal is tuned to a second intermediate frequency to provide a second intermediate frequency signal. The first and second intermediate frequency signals are combined to provide a combined intermediate frequency signal. The combined intermediate frequency signal is then predistorted to compensate for the non-linearity of the power amplifier in the transmitter to thereby provide a predistorted signal. In one embodiment, a separation between the first and second intermediate frequencies and/or a sampling rate for predistortion is minimized based on a target intermodulation order for the predistortion.

43 Claims, 31 Drawing Sheets

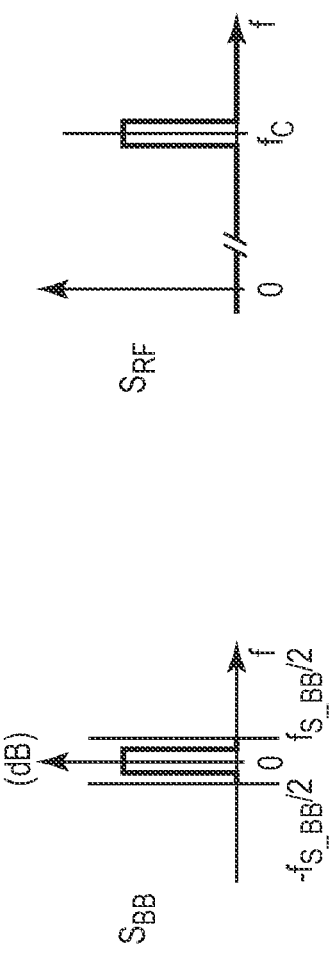
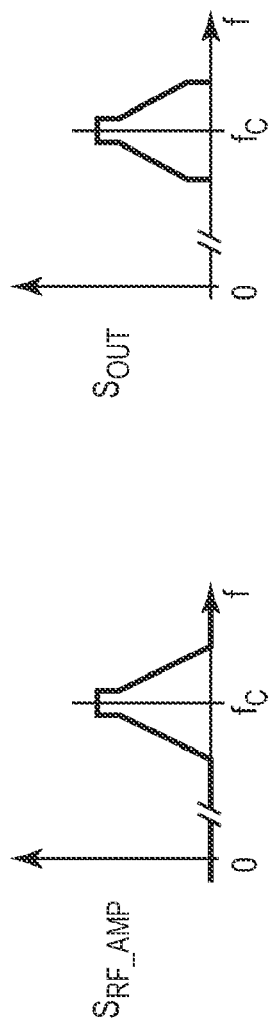
FIG. 2A (PRIOR ART)
FIG. 2B (PRIOR ART)
FIG. 2C (PRIOR ART)
FIG. 2D (PRIOR ART)

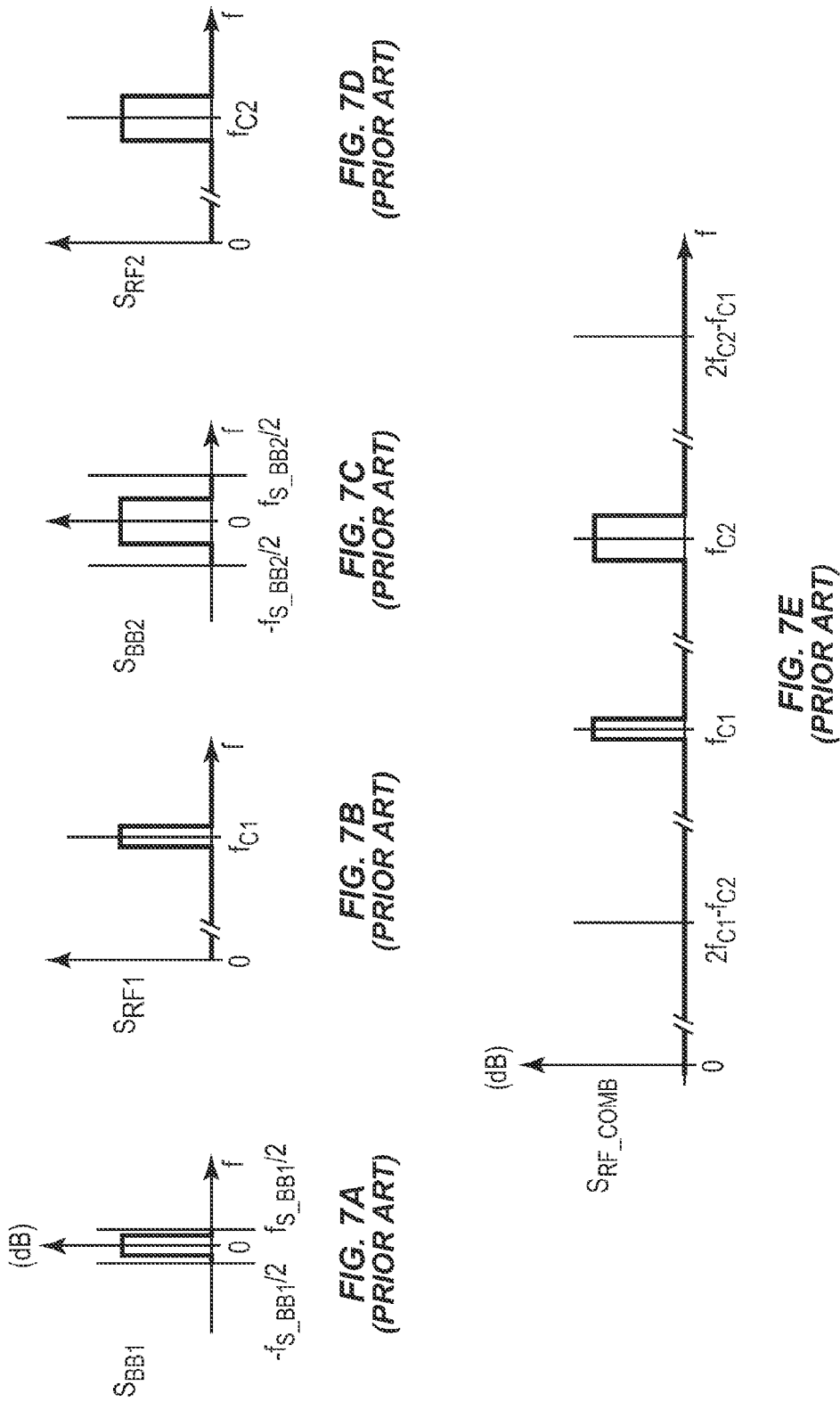

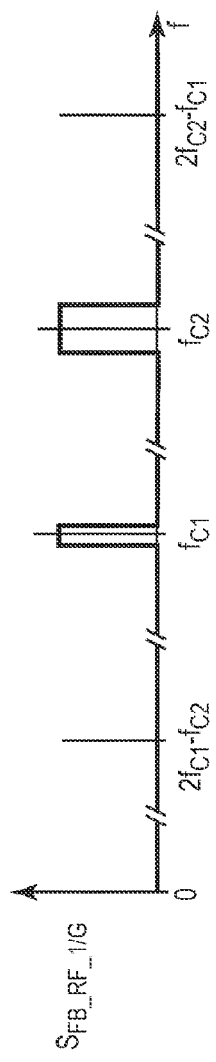
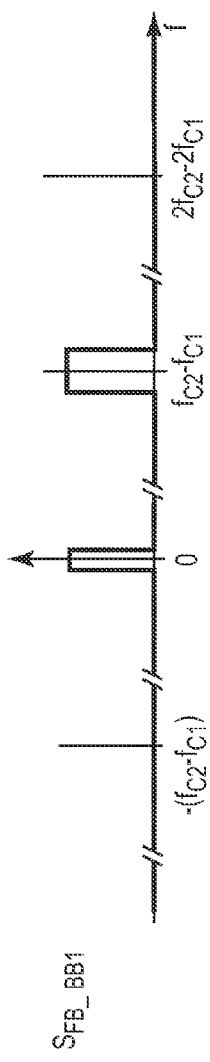
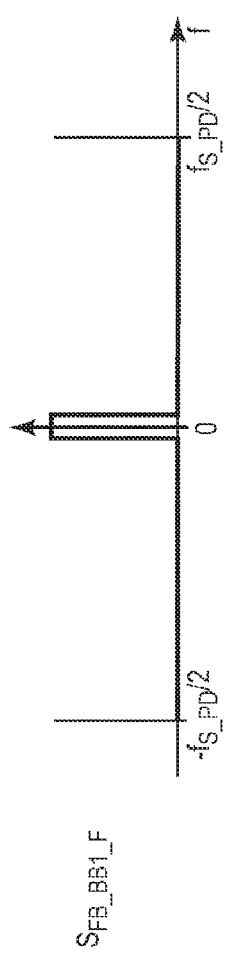
FIG. 10A
FIG. 10B
FIG. 10C

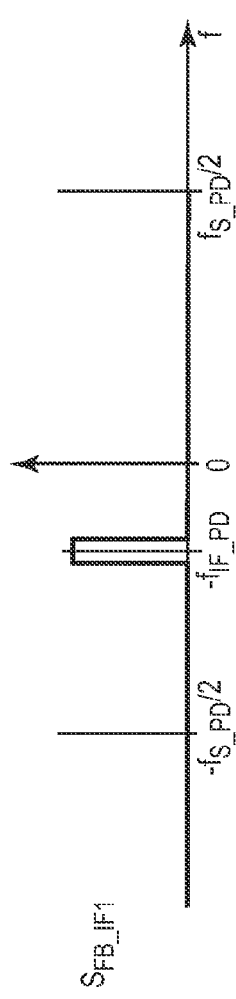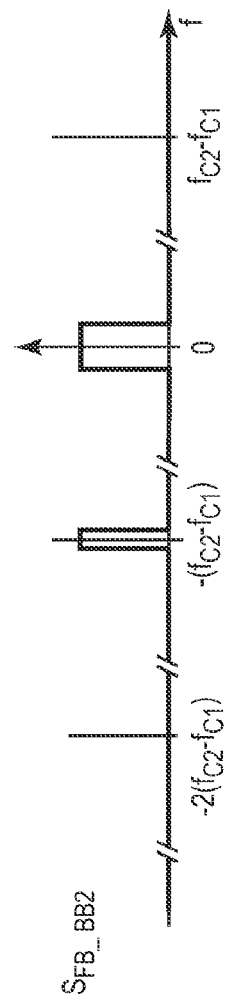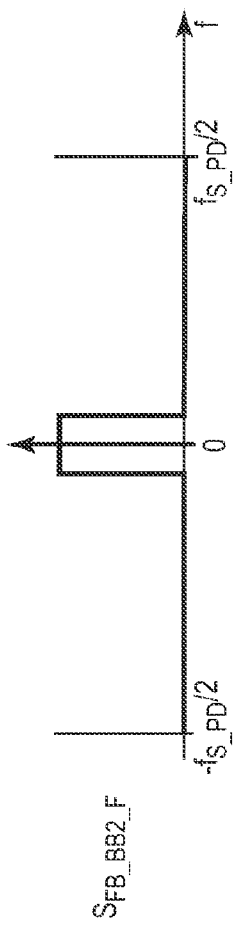

SYSTEMS AND METHODS FOR DIGITAL PREDISTORTION IN A DUAL BAND TRANSMITTER

FIELD OF THE DISCLOSURE

The present disclosure relates to digital predistortion in a dual-band transmitter.

BACKGROUND

A radio system generally includes a transmitter that transmits information-carrying signals to a receiver. The transmitter includes a power amplifier that operates to amplify the signal to be transmitted to a power level that is sufficient to enable receipt of the signal by the receiver. Radio system transmitters are required to satisfy specifications for signal levels at frequencies other than the intended transmission frequencies. Some specifications are set by government regulatory bodies, while others are set by radio communications standards such as 3GPP or IEEE 802.11. One specification, or requirement, is adjacent channel power, which is directly related to power amplifier linearity. Power amplifier linearity corresponds to an ability to reproduce an amplified version of the input signal. Also, power amplifiers are often described in terms of their efficiency, which is defined as some comparison between average transmit signal power and total average power required to generate the transmit signal power.

At a circuit level, power amplifier linearity may be achieved by biasing transistors in such a manner that the power amplifier operates in a linear fashion. However, doing so has a cost in terms of very low operating efficiency. As such, many modern power amplifiers are configured to operate at maximum efficiency, resulting in poor linearity, and use so-called "linearization" circuitry to correct non-linearity. Some exemplary power amplifiers that have high efficiency, but low linearity, are Class AB power amplifiers, Class B power amplifiers, Class C power amplifiers, Class F power amplifiers, Doherty power amplifiers, and Chireix power amplifiers.

Various linearization schemes have evolved having various trade-offs in terms of linearity, power dissipation, and versatility or robustness. These linearization schemes include, but are not limited to, analog predistortion, digital predistortion, feed-forward linearization, and feedback linearization. Predistortion linearization uses a predefined model of power amplifier non-linearity to generate an "opposite" nonlinear response that compensates for the non-linearity of the power amplifier. By amplifying the predistorted signal, the output of the power amplifier is as if the power amplifier were linear.

More specifically, FIG. 1 illustrates a conventional transmitter 10 without predistortion or, for that matter, any other linearization technology. As illustrated, the transmitter 10 includes a modem 12, an up-converter 14, a power amplifier (PA) 16, and a filter 18 connected as shown. The modem 12 outputs a baseband signal ($S_{BB}$) to the up-converter 14. The up-converter 14 operates to up-convert the baseband signal ($S_{BB}$) to a desired radio frequency, which is referred to as a carrier frequency ($f_C$), to thereby provide a radio frequency signal ($S_{RF}$). The power amplifier 16 then amplifies the radio frequency signal ($S_{RF}$) to a desired output power level to output an amplified radio frequency signal ($S_{RF\_AMP}$). Notably, as discussed below, the amplified radio frequency signal ($S_{RF\_AMP}$) contains distortion due to a non-linearity of the power amplifier 16. The amplified radio frequency signal ($S_{RF\_AMP}$) is then filtered by the filter 18 to remove out-of-band frequency components to thereby provide an output signal ($S_{OUT}$) to be transmitted by the transmitter 10.

FIGS. 2A through 2D are frequency band diagrams for the various signals in the transmitter 10 of FIG. 1. Specifically, FIG. 2A is a frequency band diagram for the baseband signal ($S_{BB}$). As shown, the baseband signal ($S_{BB}$) is centered at DC and has been sampled at a baseband sampling rate ($f_{S\_BB}$). FIG. 2B is a frequency band diagram for the radio frequency signal ($S_{RF}$) resulting from the up-conversion of the baseband signal ($S_{BB}$) to the desired carrier frequency ($f_C$). Importantly, FIG. 2C is a frequency band diagram for the amplified radio frequency signal ($S_{RF\_AMP}$) output by the power amplifier 16. When compared to the frequency band diagram for the radio frequency signal ($S_{RF}$) prior to amplification as shown in FIG. 2B, the frequency band diagram of FIG. 2C clearly illustrates a frequency-spreading effect resulting from distortion caused by the non-linearity of the power amplifier 16. Lastly, FIG. 2D is a frequency band diagram for the output signal ($S_{OUT}$) output by the filter 18.

FIG. 3 illustrates a conventional transmitter 20 that performs predistortion to compensate for distortion caused by power amplifier non-linearity. As illustrated, the transmitter 20 includes a modem 22, up-sampling circuitry 24, a predistorter (PD) 26, an up-converter 28, a power amplifier (PA) 30, and a filter 32 forming a forward path of the transmitter 20. The modem 22 outputs a baseband signal ($S_{BB}$) to the up-sampling circuitry 24. The up-sampling circuitry 24 up-samples the baseband signal ($S_{BB}$) to a predefined sampling rate for predistortion to thereby provide an up-sampled baseband signal ($S_{BB\_US}$). As discussed below, the sampling rate is greater than a bandwidth of a predistorted signal ($S_{PD}$) output by the predistorter 26. The predistorter 26 predistorts the up-sampled baseband signal ($S_{BB\_US}$) based on a defined predistortion characteristic (e.g., an N-th order polynomial predistortion characteristic) to provide the predistorted signal ($S_{PD}$). The predistortion applied by the predistorter 26 compensates for (e.g., cancels or substantially cancels) a distortion resulting from a non-linearity of the power amplifier 30. The up-converter 28 upconverts the predistorted signal ($S_{PD}$) to a desired carrier frequency to provide a radio frequency signal ($S_{RF}$), which is then amplified to a desired output power level by the power amplifier 30 to provide an amplified radio frequency signal ($S_{RF\_AMP}$). As a result of the predistortion applied by the predistorter 26, the amplified radio frequency signal ($S_{RF\_AMP}$) is as if the power amplifier 30 was a linear power amplifier. The filter 32 then removes any residual out-of-band distortion from the amplified radio frequency signal ($S_{RF\_AMP}$) to provide an output signal ($S_{OUT}$) that is transmitted by the transmitter 20.

In order to dynamically configure the predistorter 26, the transmitter 20 also includes a feedback path including a filter 34, an attenuator 36, a down-converter 38, and an adaptor 40 connected as shown. The filter 34 is coupled to the output of the power amplifier 30 and operates to remove out-of-band frequency components from the amplified radio frequency signal ($S_{RF\_AMP}$) to provide a radio frequency feedback signal ($S_{FB\_RF}$). The attenuator 36 then attenuates the radio frequency feedback signal ($S_{FB\_RF}$) by a factor 1/G, where G is equal to or approximately equal to a gain of the power amplifier 30, to thereby provide an attenuated radio frequency feedback signal ($S_{FB\_RF\_1/G}$). The down-converter 38 then down-converts the attenuated radio frequency feedback signal ($S_{FB\_RF\_1/G}$) to baseband to provide a baseband feedback signal ($S_{FB\_BB}$). Based on the baseband feedback signal ($S_{FB\_BB}$) and the up-sampled baseband signal ($S_{BB\_US}$), the adaptor 40 dynamically configures the predistorter 26 using a known adaptation technique.

FIGS. 4A through 4E are frequency band diagrams for the various signals in the forward path of the transmitter 20 of FIG. 3. Specifically, FIG. 4A is a frequency band diagram for the baseband signal ($S_{BB}$), which has a sampling rate ($f_{S\_BB}$). FIG. 4B is a frequency band diagram for the up-sampled baseband signal ($S_{BB\_US}$) output by the up-sampling circuitry 24, which has a sampling rate ($f_{S\_PD}$), where $f_{S\_PD} > f_{S\_BB}$. Next, FIG. 4C is a frequency band diagram for the predistorted signal ($S_{PD}$) output by the predistorter 26. As shown, a frequency spreading effect results from the predistortion applied by the predistorter 26. The sampling rate ($f_{S\_PD}$) is selected such that $f_{S\_PD}/2$ is greater than ½ of a bandwidth of the predistorted signal ($S_{PD}$). FIG. 4D is a frequency band diagram for the radio frequency signal ($S_{RF}$) output by the up-converter 28. The radio frequency signal ($S_{RF}$) is centered as a desired carrier frequency ($f_C$). Lastly, FIG. 4E is a frequency band diagram for the amplified radio frequency signal ($S_{RF\_AMP}$) output by the power amplifier 30. As shown, the predistortion applied by the predistorter 26 compensates for the non-linearity of the power amplifier 30 such that the amplified radio frequency signal ($S_{RF\_AMP}$) is as if the power amplifier 30 were a linear power amplifier.

FIGS. 5A through 5C are frequency band diagrams for the various signals in the feedback path of the transmitter 20 of FIG. 3. Specifically, FIG. 5A is a frequency band diagram for the radio frequency feedback signal ($S_{FB\_RF}$) output by the filter 34. FIG. 5B is a frequency band diagram for the attenuated radio frequency feedback signal ($S_{FB\_RF\_1/G}$) output by the attenuator 36. Lastly, FIG. 5C is a frequency band diagram for the baseband feedback signal ($S_{FB\_BB}$) output by the down-converter 38.

In the transmitter 20 of FIG. 3, predistortion is performed for a single band signal. However, many modern applications use dual-band signals. As used herein, a dual-band signal is a signal that occupies two distinct frequency bands. More specifically, a dual-band signal contains frequency components occupying a certain continuous bandwidth referred to as a first frequency band and frequency components occupying another continuous bandwidth referred to as a second frequency band. The dual-band signal contains no frequency components between the first and second frequency bands. One exemplary application for dual-band signals is a multi-standard cellular communication system. A base station in a multi-standard cellular communication system may be required to simultaneously, or concurrently, transmit signals for two different cellular communications protocols (i.e., transmit a dual-band signal). Similarly, in some scenarios, a base station in a Long Term Evolution (LTE) cellular communications protocol may be required to simultaneously transmit signals in separate frequency bands.

FIG. 6 illustrates a conventional dual-band transmitter 42. The dual-band transmitter 42 includes a first modem 44 that outputs a first baseband signal ($S_{BB1}$) and a first up-converter 46 that up-converts the first baseband signal ($S_{BB1}$) to a first carrier frequency ($f_{C1}$) to thereby provide a first radio frequency signal ($S_{RF1}$). The dual-band transmitter 42 also includes a second modem 48 that outputs a second baseband signal ($S_{BB2}$) and a second up-converter 50 that up-converts the second baseband signal ($S_{BB2}$) to a second carrier frequency ($f_{C2}$) to thereby provide a second radio frequency signal ($S_{RF2}$). A combiner 52 combines the first and second radio frequency signals ($S_{RF1}$ and $S_{RF2}$) to provide a combined radio frequency signal ($S_{RF\_COMB}$), which is a dual-band signal. A power amplifier (PA) 54 then amplifies the combined radio frequency signal ($S_{RF\_COMB}$) to a desired output power level to thereby provide an amplified radio frequency signal ($S_{RF\_AMP}$), which is also a dual-band signal.

A filter 56 then removes out-of-band, or undesired, frequency components from the amplified radio frequency signal ($S_{RF\_AMP}$) to provide an output signal ($S_{OUT}$).

FIGS. 7A through 7G are frequency band diagrams for the various signals in the dual-band transmitter 42 of FIG. 6. Specifically, FIG. 7A is a frequency band diagram for the first baseband signal ($S_{BB1}$), where the sampling rate for the first baseband signal ($S_{BB1}$) is $f_{S\_BB}$. FIG. 7B is a frequency band diagram for the first radio frequency signal ($S_{RF1}$) output by the first up-converter 46. Likewise, FIGS. 7C and 7D are frequency band diagrams for the second baseband signal ($S_{BB2}$) and the second radio frequency signal ($S_{RF2}$), respectively. FIG. 7E is a frequency band diagram for the combined radio frequency signal ($S_{RF\_COMB}$) output by the combiner 52. As illustrated, the combined radio frequency signal ($S_{RF\_COMB}$) is a dual-band signal having a first frequency band centered at the first carrier frequency ($f_{C1}$) and a second frequency band centered at the second carrier frequency ($f_{C2}$).

FIG. 7F is a frequency band diagram for the amplified radio frequency signal ($S_{RF\_AMP}$) output by the power amplifier 54. As a result of the non-linearity of the power amplifier 54, a frequency-spreading effect is seen for the frequency bands centered at the first and second carrier frequencies ($f_{C1}$ and $f_{C2}$). In addition, as a result of third-order intermodulation distortion caused by the non-linearity of the power amplifier 54 and the dual-band nature of the combined radio frequency signal ($S_{RF\_COMB}$) input to the power amplifier 54, the amplified radio frequency signal ($S_{RF\_AMP}$) also includes frequency bands centered at frequencies of $2f_{C1}-f_{C2}$ and $2f_{C2}-f_{C1}$. Note that, while not shown, the combined radio frequency signal ($S_{RF\_COMB}$) may also include higher order intermodulation distortion. Lastly, FIG. 7G is a frequency band diagram for the output signal ($S_{OUT}$), which shows that the filter 56 removed the unwanted frequency bands (e.g., the frequency bands resulting from the third-order intermodulation distortion centered at the frequencies of $2f_{C1}-f_{C2}$ and $2f_{C2}-f_{C1}$).

Predistortion to compensate for power amplifier non-linearities for a dual-band transmitter presents several problems. This is particularly true if the dual-band transmitter is desired to include a predistorter that simultaneously performs predistortion for each of the frequency bands of the dual-band signal. As such, there is a need for systems and methods for performing predistortion in a dual-band transmitter.

SUMMARY

Systems and methods for providing digital predistortion to compensate for a non-linearity of a power amplifier in a dual-band transmitter are disclosed. In one embodiment, a first baseband signal is tuned to a first intermediate frequency to provide a first intermediate frequency signal. Likewise, a second baseband signal is tuned to a second intermediate frequency to provide a second intermediate frequency signal. The first and second intermediate frequency signals are combined to provide a combined intermediate frequency signal having a first frequency component centered at the first intermediate frequency and a second frequency component centered at the second intermediate frequency. The combined intermediate frequency signal is then predistorted to compensate for the non-linearity of the power amplifier in the transmitter to thereby provide a predistorted signal.

In one embodiment, a separation between the first and second intermediate frequencies is minimized based on a target intermodulation order (e.g., third-order intermodulation distortion, fifth-order intermodulation distortion, etc.) for the predistortion. More specifically, the separation between the first and second intermediate frequencies is minimized by being set equal to or near a minimum separation value below which frequency bands in the predistorted signal for up to the target intermodulation order start to overlap the frequency bands in the predistorted signal centered at the first and second intermediate frequencies. By minimizing the separation between the first and second intermediate frequencies, a sampling rate used for predistortion can be reduced, thereby reducing the complexity of the predistorter.

In one embodiment, the target predistortion order is the $(2k+1)$th-order where k is an integer greater than or equal to 1, and the separation between the first intermediate frequency and the second intermediate frequency is minimized by being set equal to or near two times a minimum intermediate frequency value. The minimum intermediate frequency value is defined as $(1/4)BW_1+(1/4)BW_2+k*\max(BW_1, BW_2)$, where k is an integer greater than or equal to 1, $BW_1$ is a bandwidth of the first baseband signal, and $BW_2$ is a bandwidth of the second baseband signal. In one embodiment, the target intermodulation order is a third-order intermodulation. In another embodiment, the target intermodulation order is a fifth-order intermodulation. In yet another embodiment, the target intermodulation order is a seventh-order intermodulation.

In one embodiment, the first and second intermediate frequencies are symmetrical. Specifically, the first intermediate frequency is a negative frequency, the second intermediate frequency is a positive frequency, and an absolute value of the first intermediate frequency is equal to an absolute value of the second intermediate frequency. In this embodiment, when targeting the $(2k+1)$th intermodulation order, the absolute value of the first and second intermediate frequencies is set equal to or near $(1/4)BW_1+(1/4)BW_2+k*\max(BW_1, BW_2)$, where k is an integer greater than or equal to 1, $BW_1$ is a bandwidth of the first baseband signal, and $BW_2$ is a bandwidth of the second baseband signal.

In another embodiment, the first and second intermediate frequencies are asymmetrical such that the first intermediate frequency, $f_{IF\_PD\_1}$, is equal to $-f_{IF\_PD}$ plus a predefined frequency offset, $f_{IF\_PD\_OFFSET}$, and the second intermediate frequency, $f_{IF\_PD\_2}$ is equal to $f_{IF\_PD}$ plus the predefined frequency offset, $f_{IF\_PD\_OFFSET}$, where $f_{IF\_PD}$ is a base intermediate frequency for predistortion. Further, the target predistortion order is the $(2k+1)$th-order. In this embodiment, separation between the first and second intermediate frequencies is minimized by setting the first and second intermediate frequencies such that the base intermediate frequency, $f_{IF\_PD}$, is equal to or near $(1/4)BW_1+(1/4)BW_2+k*\max(BW_1, BW_2)$.

In one embodiment, prior to tuning, the first and second baseband signals are up-sampled to a defined sampling rate for predistortion, and the defined sampling rate is minimized based on a target predistortion order (e.g., third-order intermodulation distortion, fifth-order intermodulation distortion, etc.). More specifically, the defined sampling rate for predistortion is equal to or near a frequency below which frequency bands for the target modulation order alias into the frequency bands centered at the first and second intermediate frequencies in the predistorted signal.

In one embodiment, the first and second intermediate frequencies are symmetrical such that the first intermediate frequency is a negative frequency, the second intermediate frequency is a positive frequency, and an absolute value of the first intermediate frequency is equal to an absolute value of the second intermediate frequency. Further, the target predistortion order is the $(2k+1)$th-order. In this embodiment, the sampling rate for predistortion is minimized by being set equal to or near $(2k+2)*f_{IF\_PD}+((k+1)/2)BW_1+((k+1)/2)BW_2+k*\max(BW_1, BW_2)$, where k is an integer greater than or equal to 1, $f_{IF\_PD}$ is an absolute value of both the first and second intermediate frequencies, $BW_1$ is a bandwidth of the first baseband signal, and $BW_2$ is a bandwidth of the second baseband signal. In one preferred embodiment, the absolute value of the first and second intermediate frequencies is also minimized based on the target predistortion order, which enables further decrease in the sampling rate for predistortion. More specifically, when targeting the $(2k+1)$th-order, the absolute value of the first and second intermediate frequencies is minimized by being set equal to or near $(1/4)BW_1+(1/4)BW_2+k*\max(BW_1, BW_2)$.

In another embodiment, the first and second intermediate frequencies are asymmetrical such that the first intermediate frequency, $f_{IF\_PD\_1}$, is equal to $-f_{IF\_PD}$ plus a predefined frequency offset, $f_{IF\_PD\_OFFSET}$, and the second intermediate frequency, $f_{IF\_PD\_2}$, is equal to $f_{IF\_PD}$ plus the predefined frequency offset, $f_{IF\_PD\_OFFSET}$, where $f_{IF\_PD}$ is a base intermediate frequency for predistortion. Further, the target predistortion order is the $(2k+1)$th-order. In this embodiment, the sampling rate for predistortion is minimized by being set equal to or near $(2k+2)*f_{IF\_PD}+((k+1)/2)BW_1+((k+1)/2)BW_2+k*\max(BW_1, BW_2)$, where k is an integer greater than or equal to 1, $f_{IF\_PD}$ is the base intermediate frequency for predistortion, $BW_1$ is a bandwidth of the first baseband signal, and $BW_2$ is a bandwidth of the second baseband signal. In one preferred embodiment, the separation between the first and second intermediate frequencies is also minimized based on the target predistortion order, which enables further decrease in the sampling rate for predistortion. More specifically, when targeting the $(2k+1)$th-order, the separation between the first and second intermediate frequencies is minimized by setting the first and second intermediate frequencies such that the base intermediate frequency, $f_{IF\_PD}$, is equal to or near $(1/4)BW_1+(1/4)BW_2+k*\max(BW_1, BW_2)$.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 2A through 2D are frequency band diagrams for the various signals in the single-band transmitter of FIG. 1;

FIGS. 7A through 7G are frequency band diagrams for the various signals in the dual-band transmitter of FIG. 6;

FIGS. 10A through 10H are frequency band diagrams for the various signals in the feedback path of the dual-band transmitter of FIG. 8 according to one embodiment of the present disclosure;

Figure 1:
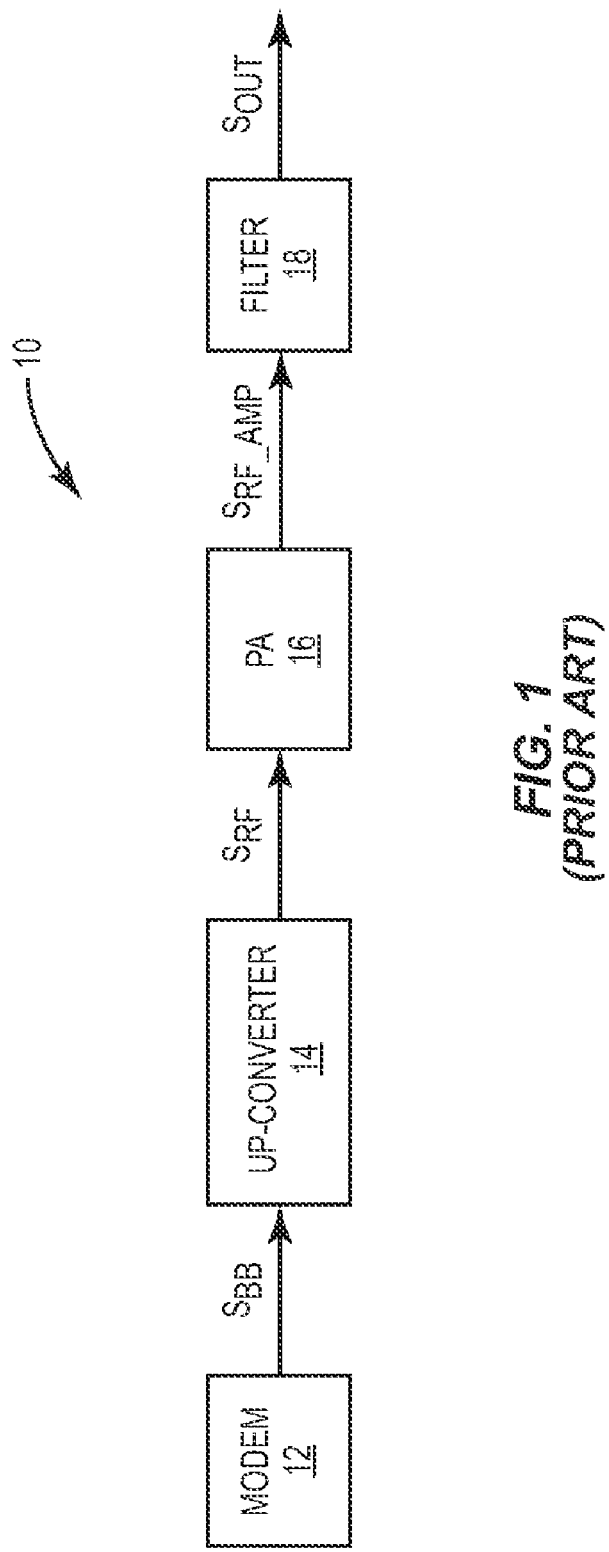
FIG. 1 illustrates a conventional single-band transmitter without digital predistortion to compensate for power amplifier non-linearity.
Figure 3:
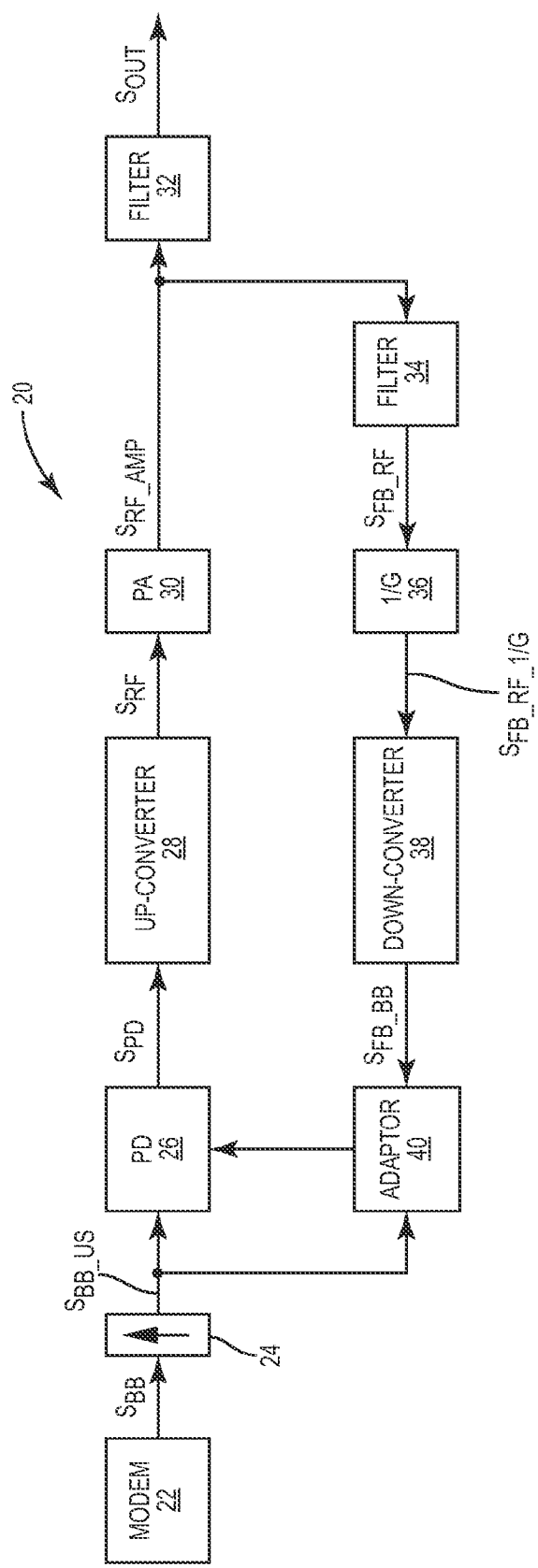
FIG. 3 illustrates a conventional single-band transmitter with digital predistortion to compensate for power amplifier non-linearity.
Figure 4A:
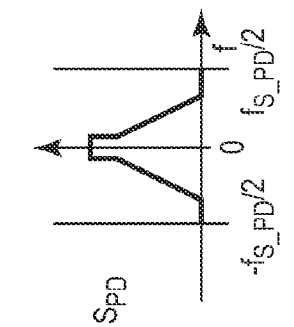
FIGS. 4A through 4E are frequency band diagrams for the various signals in the forward path of the single-band transmitter of FIG. 3.
Figure 4B:
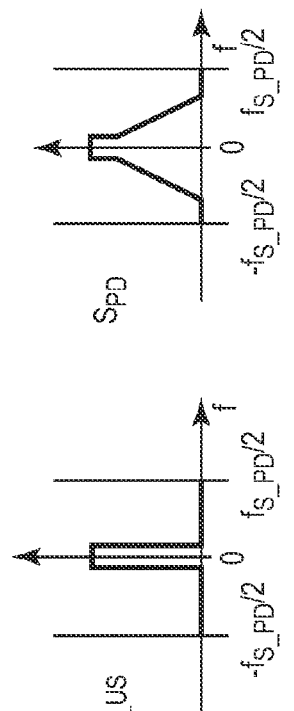
Figure 4C:
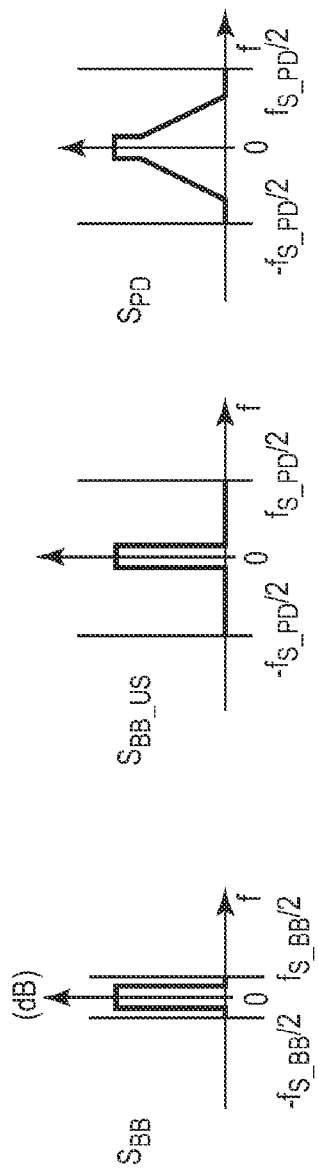
Figure 4D:
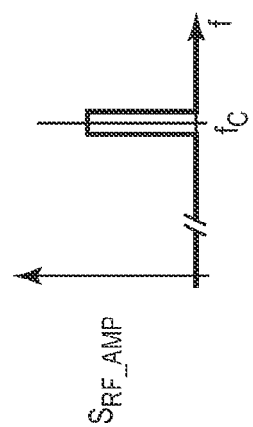
Figure 4E:
Figure 5C:
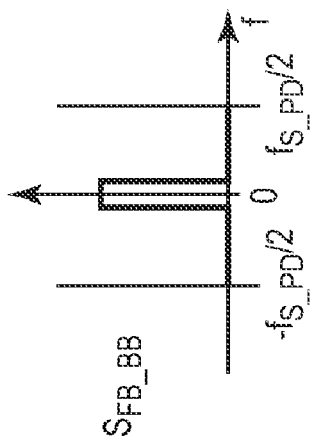
FIGS. 5A through 5C are frequency band diagrams for the various signals in the feedback path of the single-band transmitter of FIG. 3.
Figure 5B:
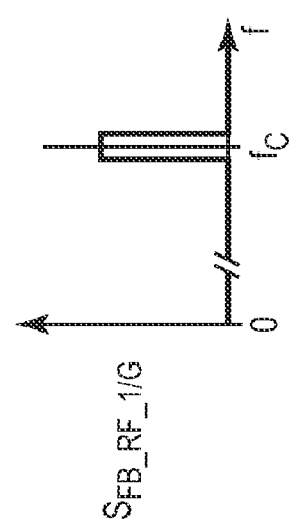
Figure 5A:
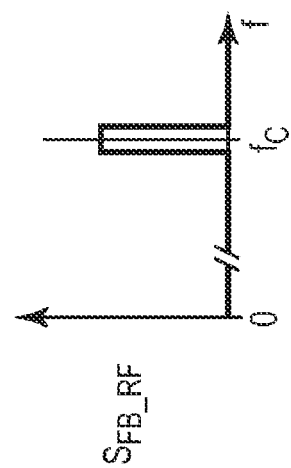
Figure 6:
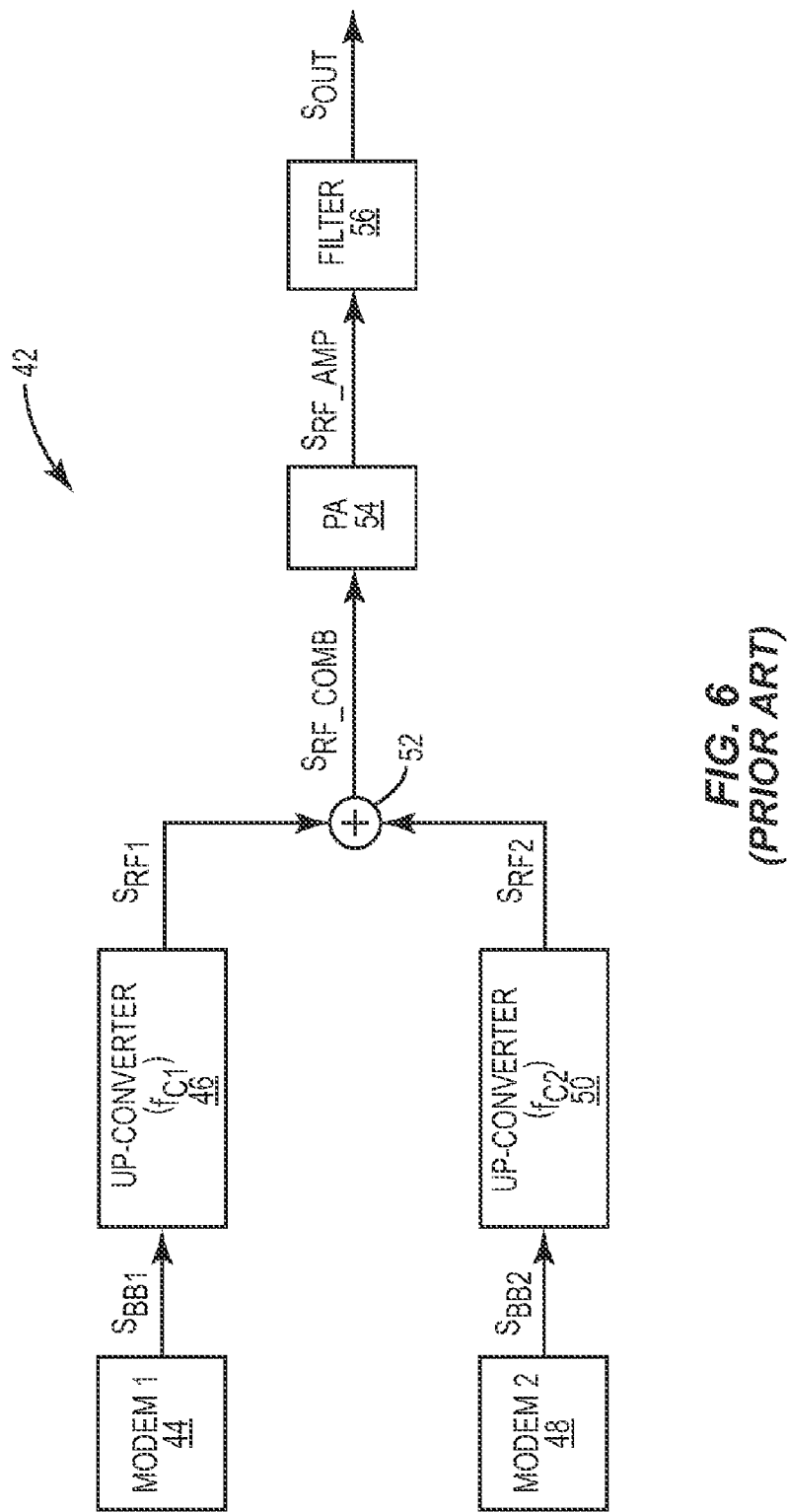
FIG. 6 illustrates a conventional dual-band transmitter without digital predistortion to compensate for power amplifier non-linearity.
Figure 7F:
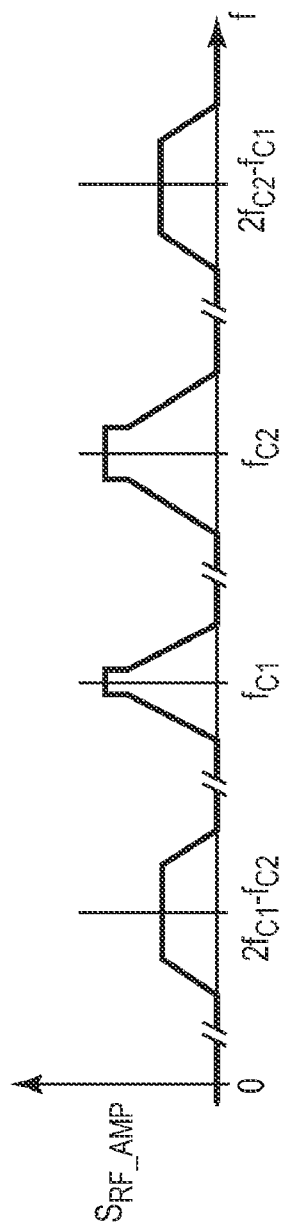
Figure 7G:
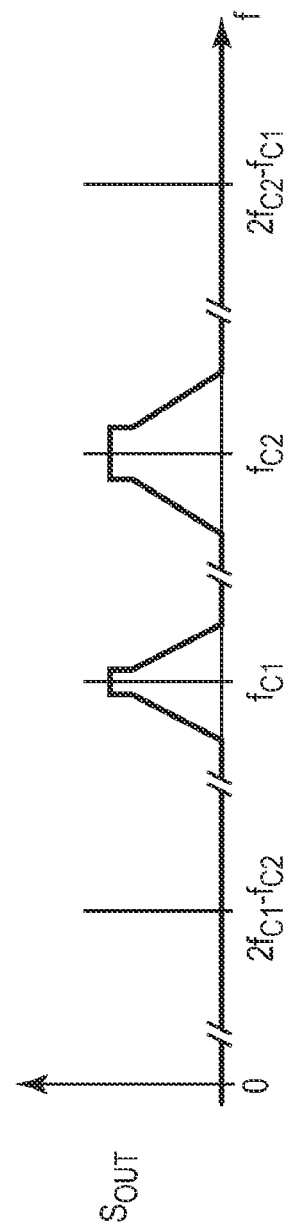
Figure 8:
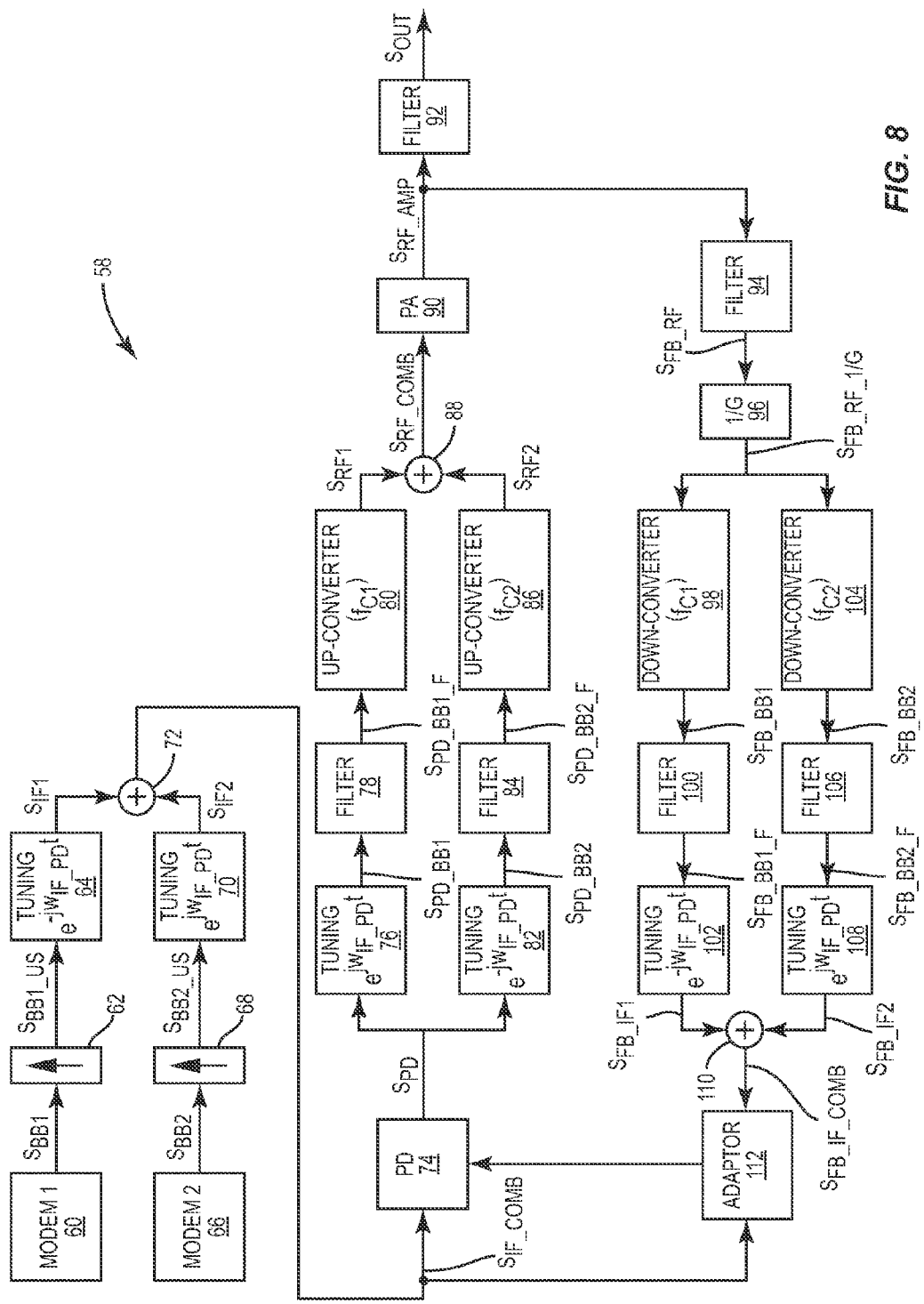
FIG. 8 illustrates a dual-band transmitter with digital predistortion to compensate for power amplifier non-linearity according to one embodiment of the present disclosure.
Figure 11:
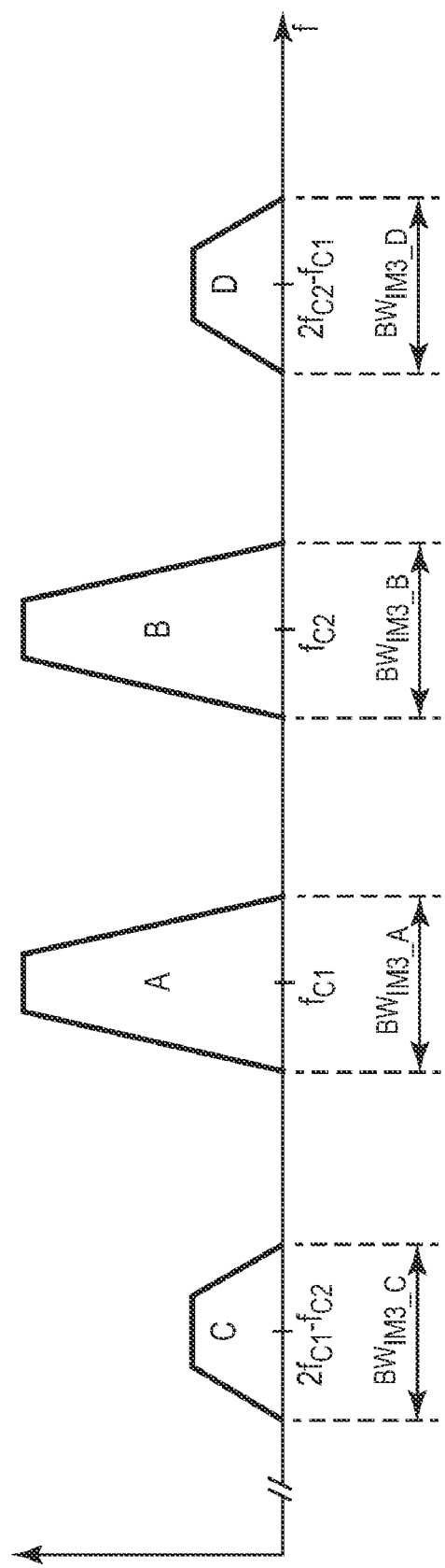
Figure 12:
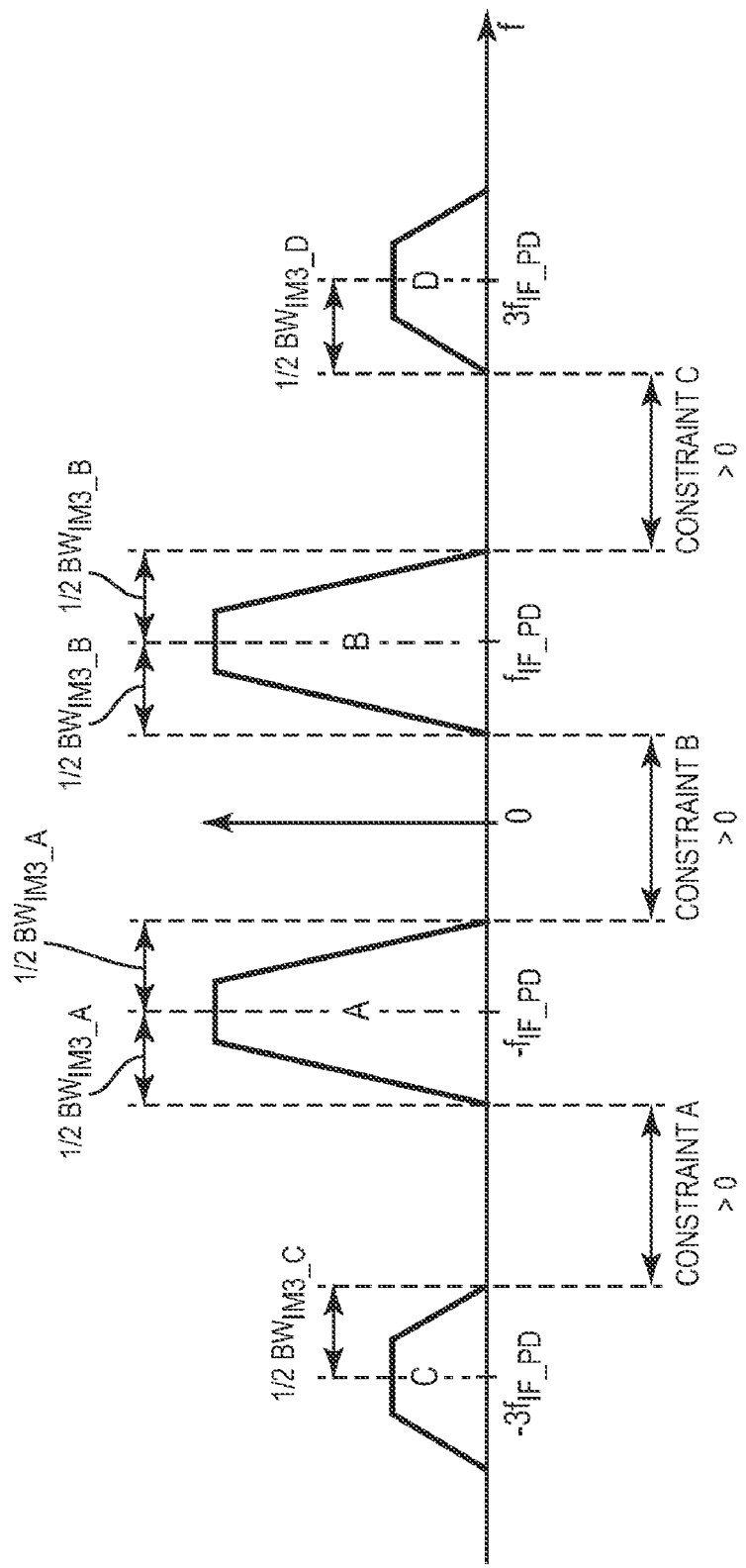
Figure 13:
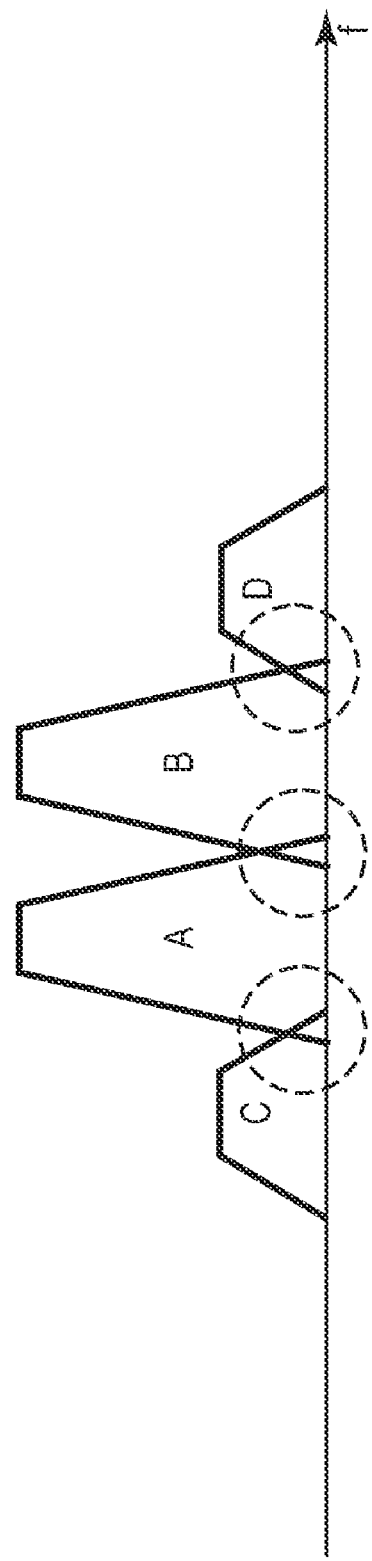
Figure 14:
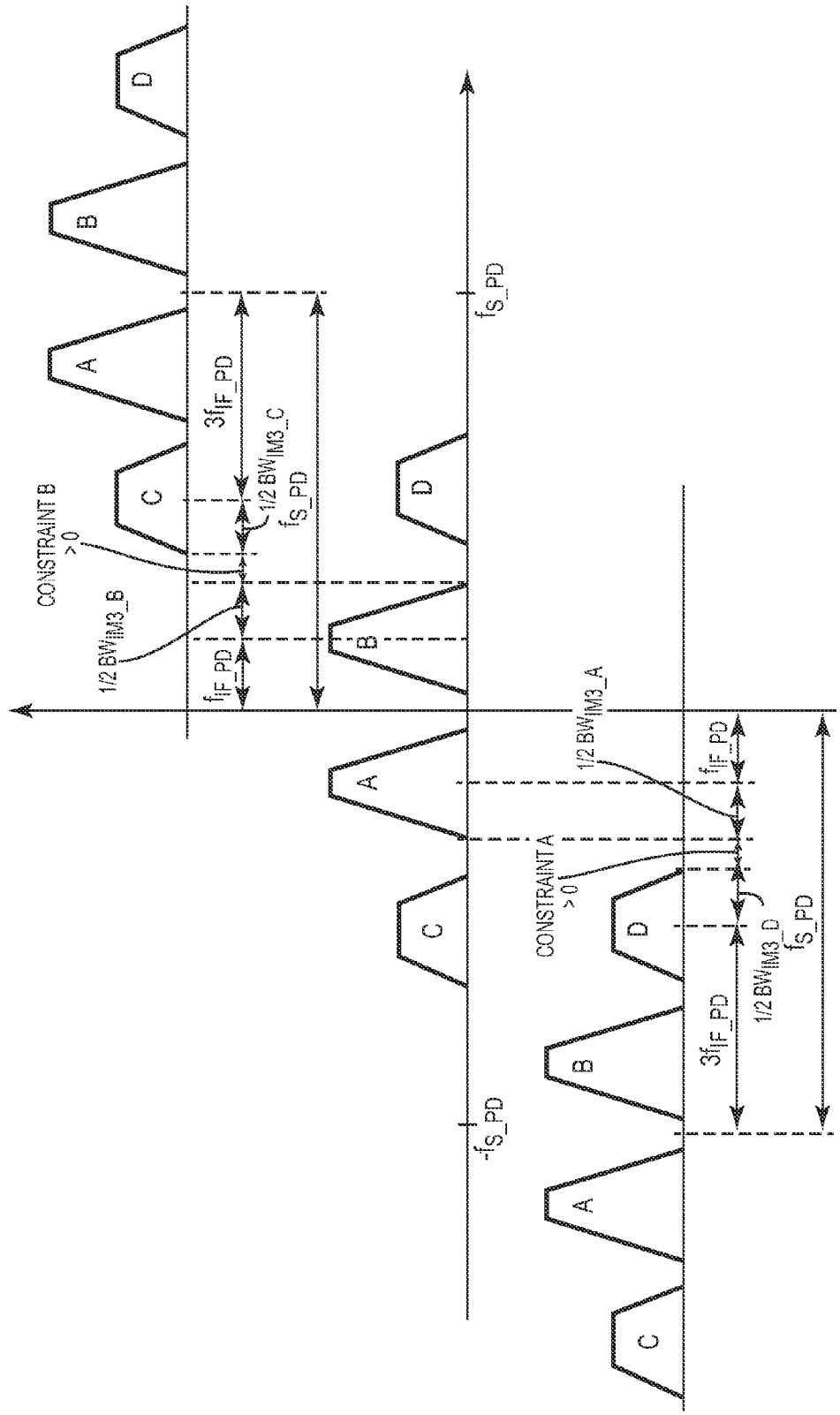
Figure 15:
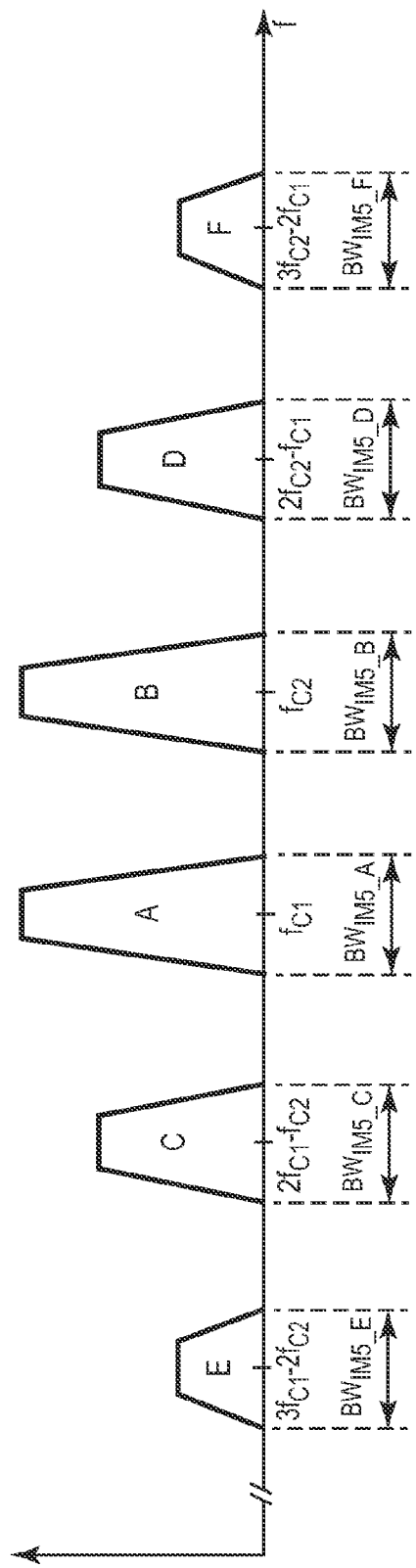
Figure 16:
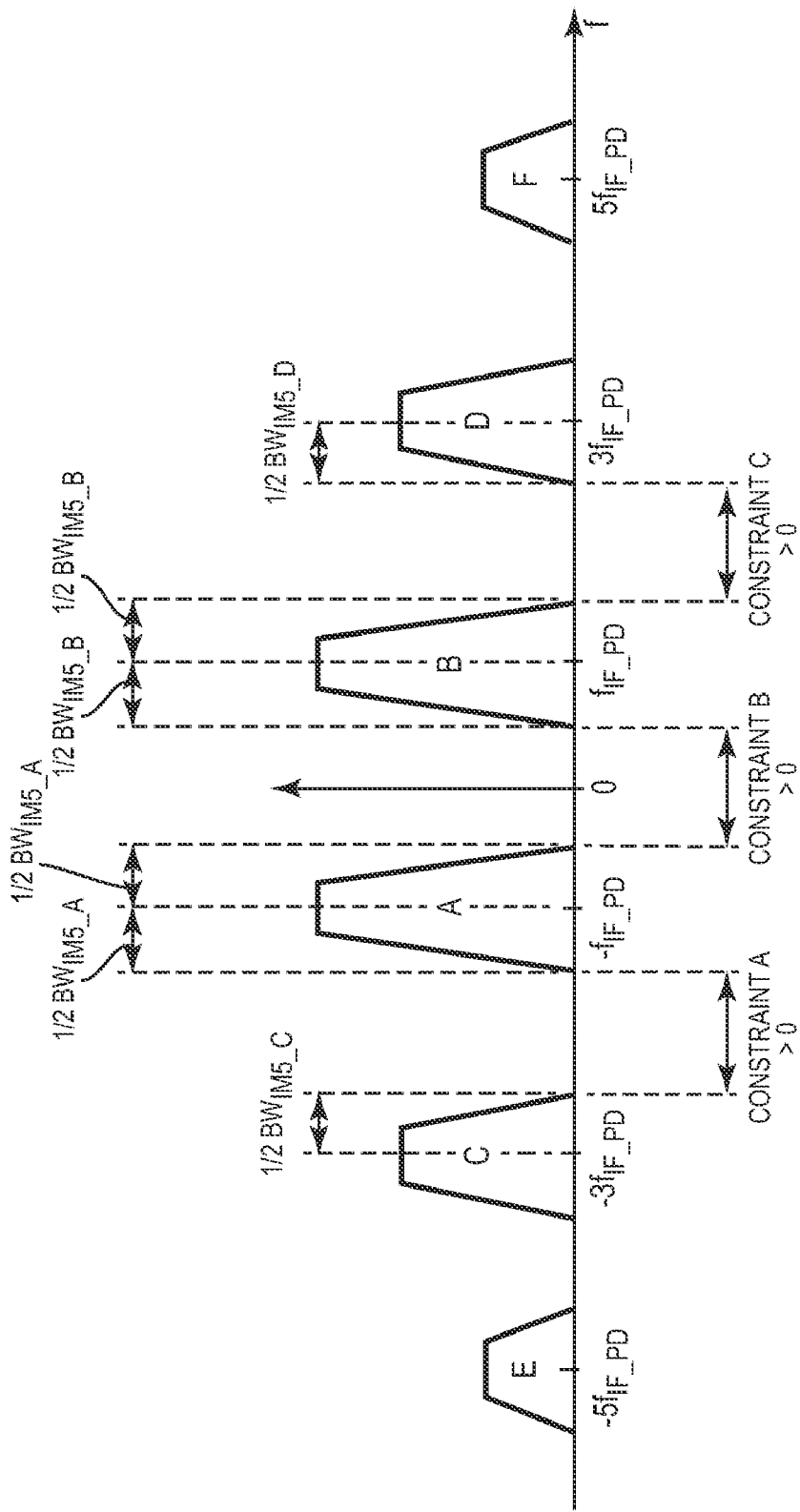
Figure 17:
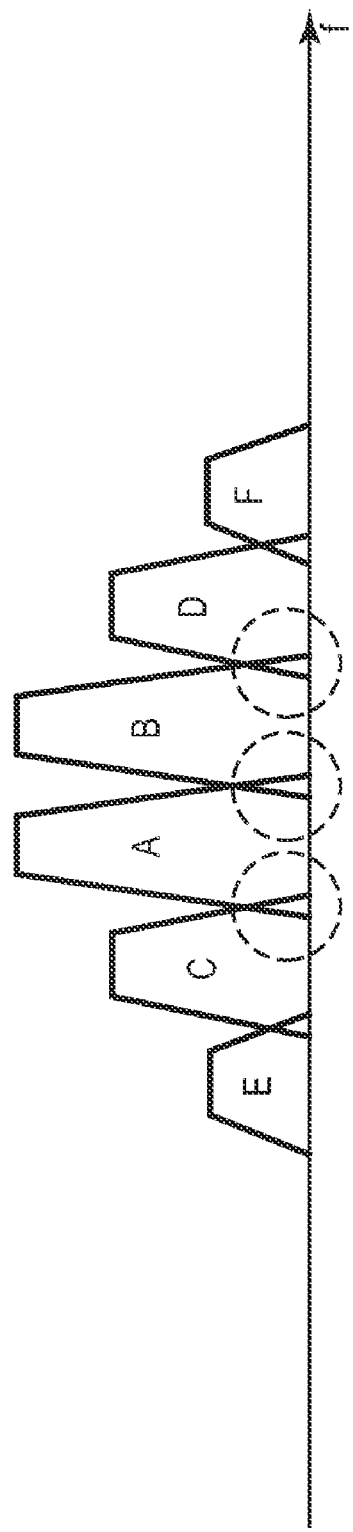
Figure 18:
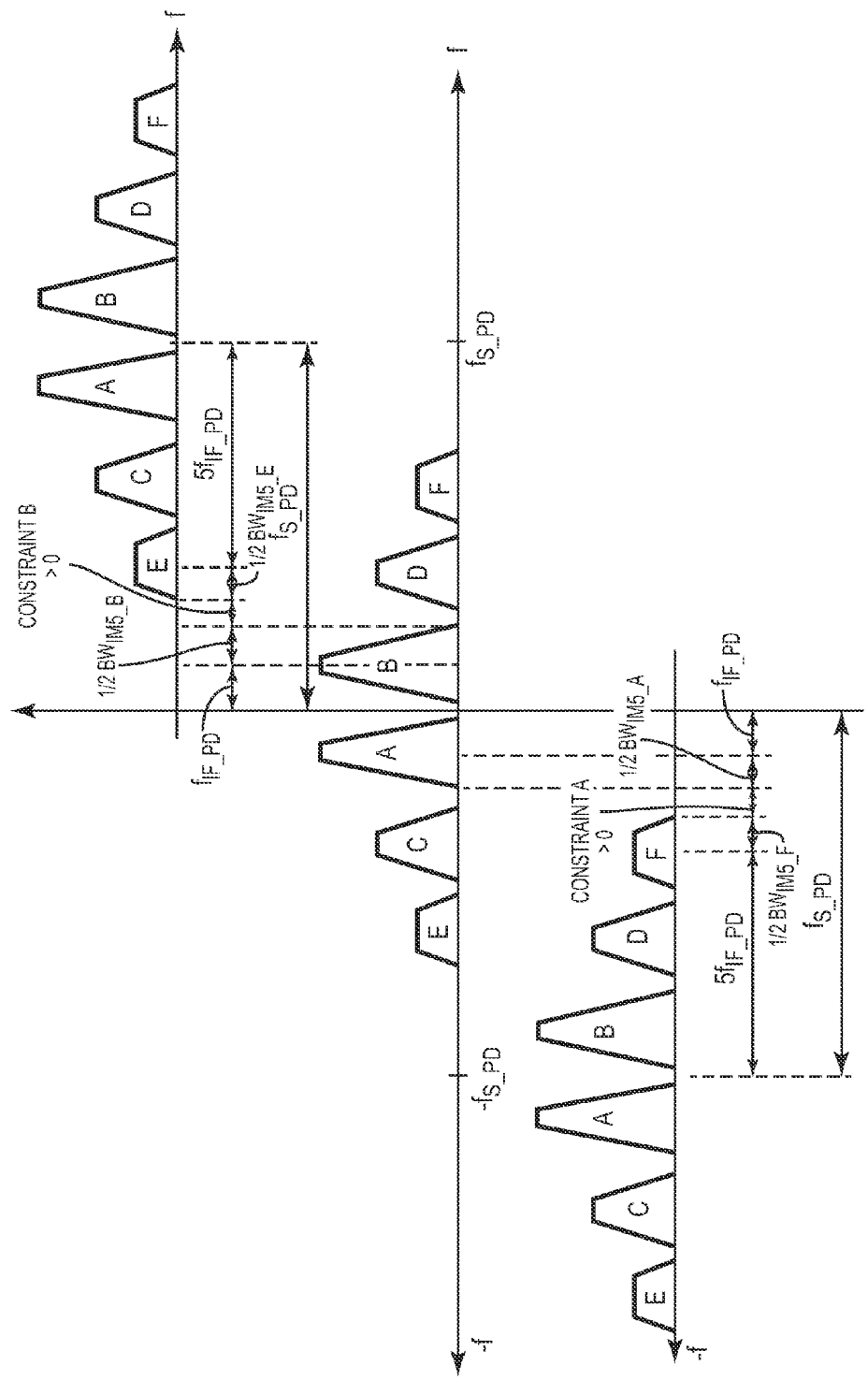
Figure 19:
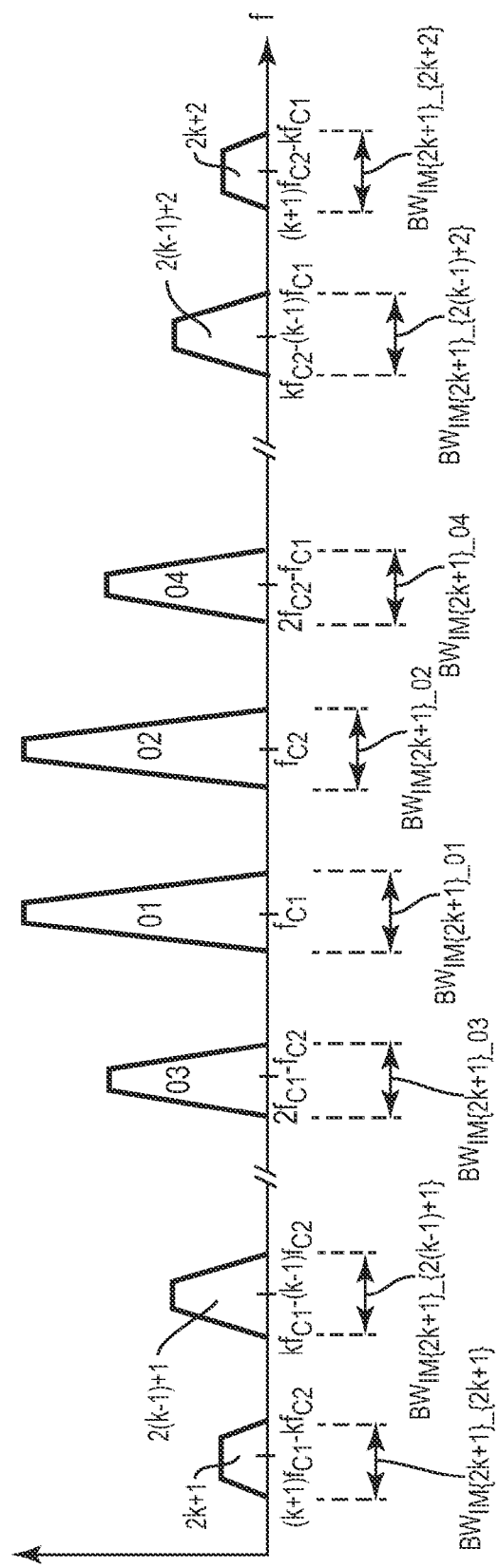
Figure 20:
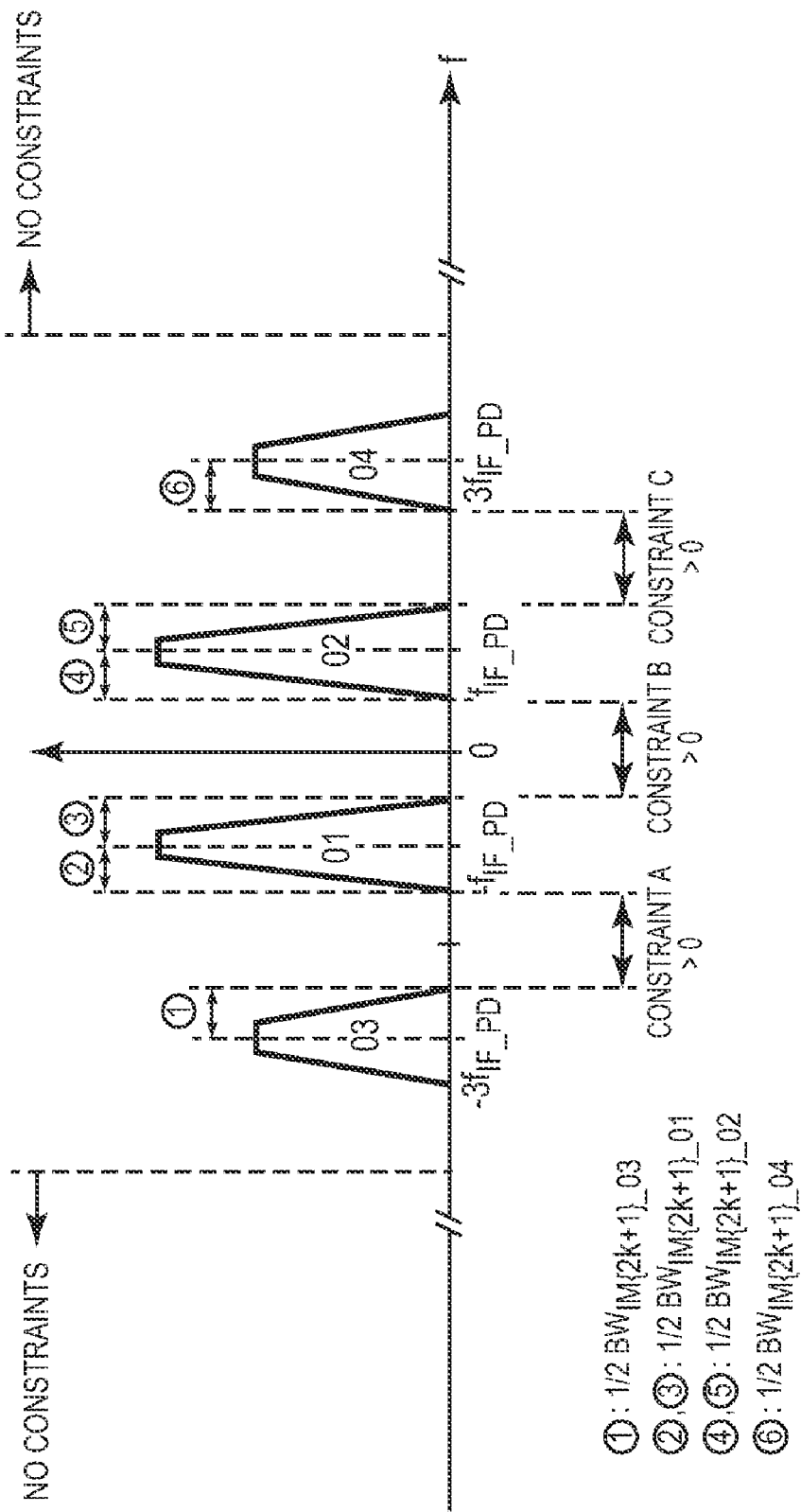
Figure 21:
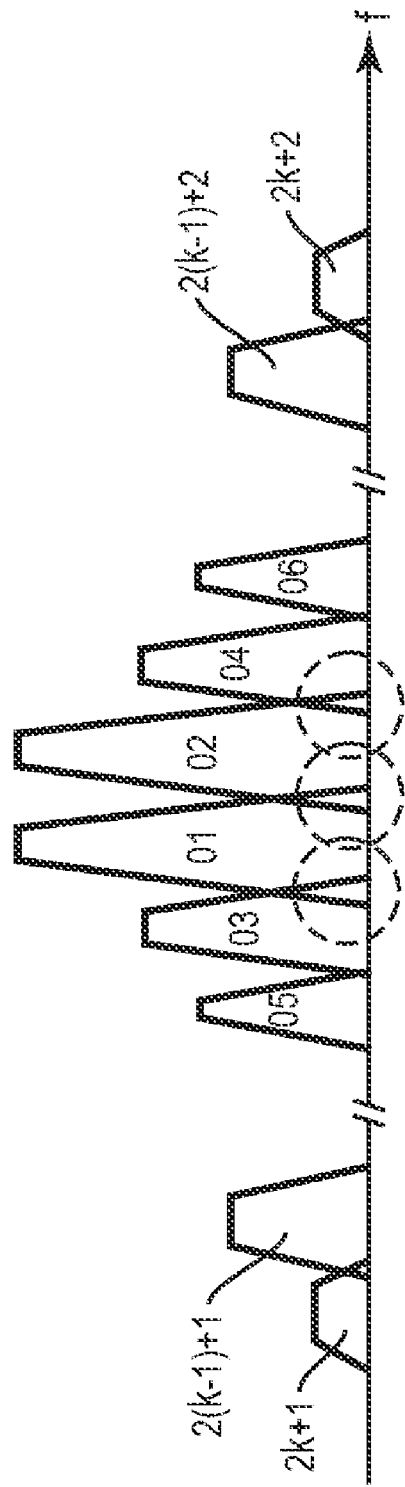
Figure 22:
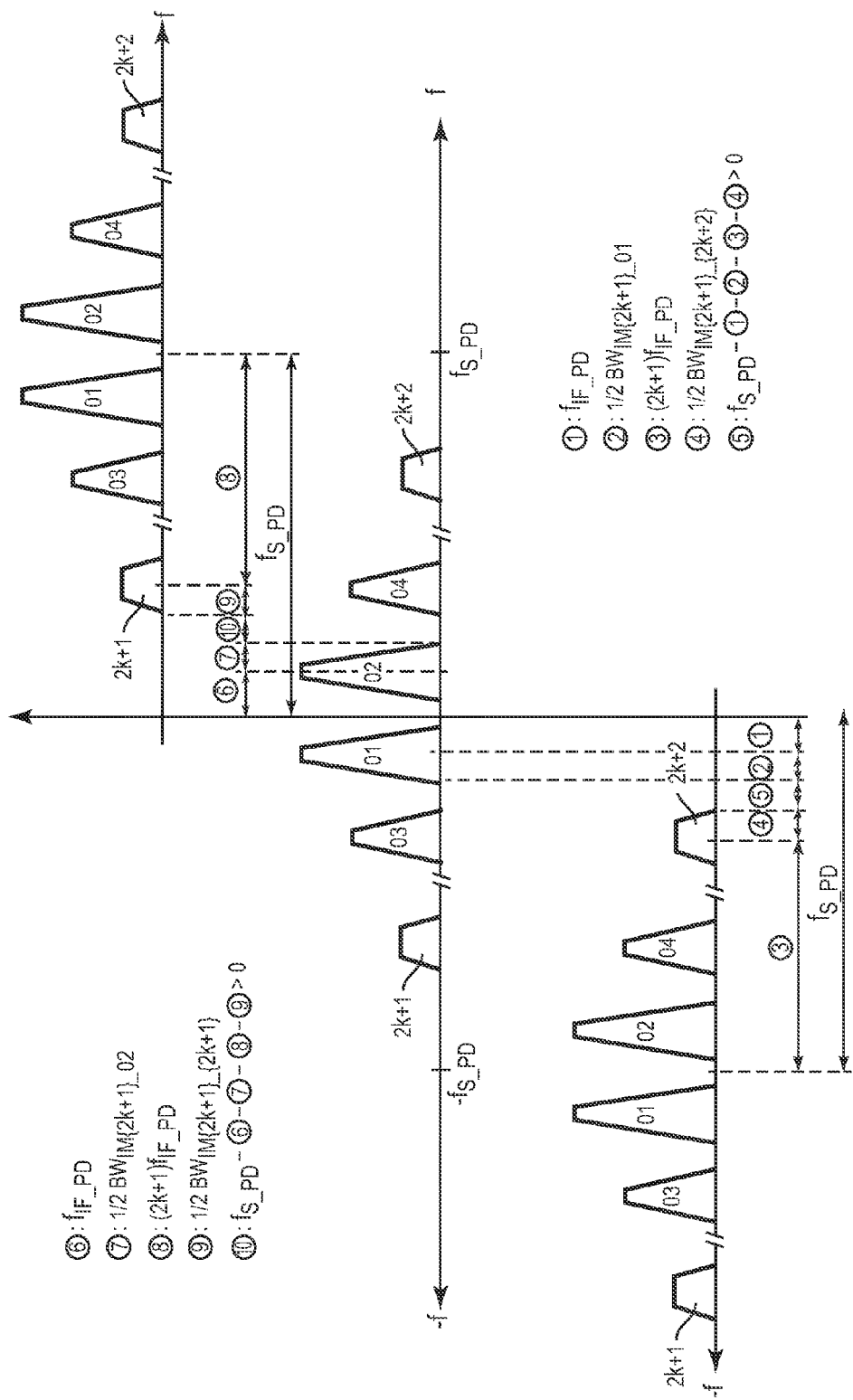
Figure 23:
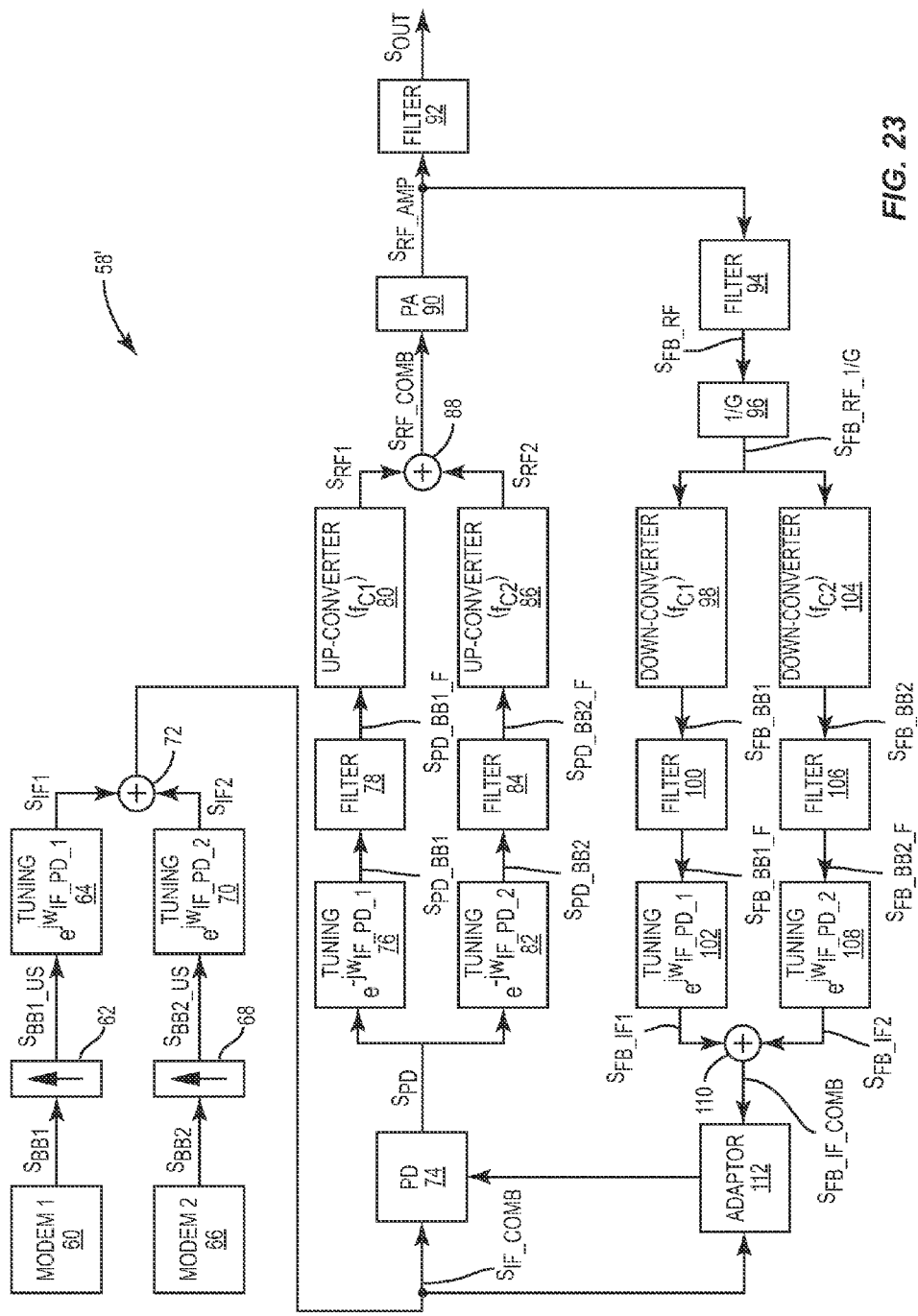
Figure 24:
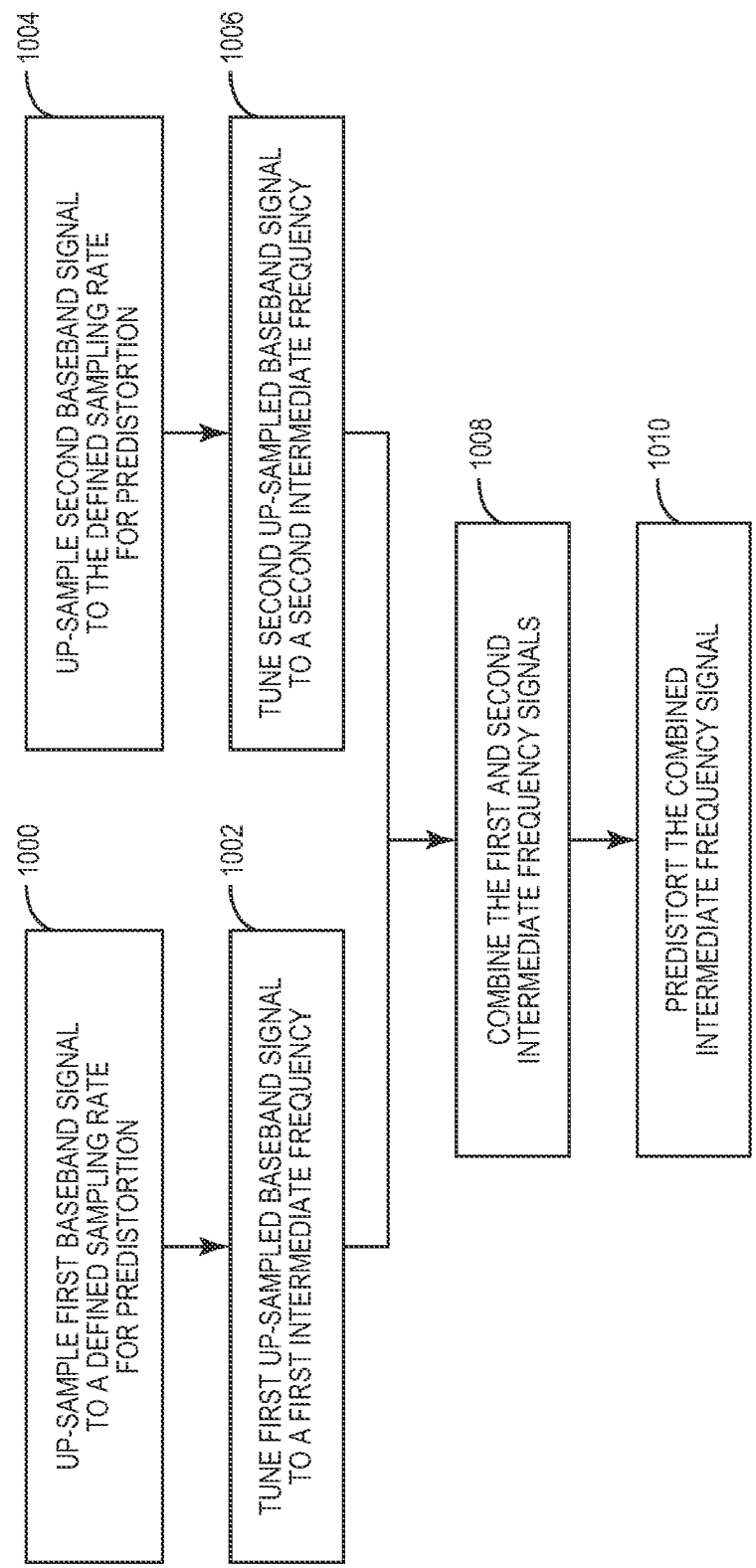

FIG. 11 graphically illustrates the bandwidths of the frequency bands in the predistorted combined radio frequency signal prior to amplification by the power amplifier in the dual-band transmitter of FIG. 8 when targeting third-order intermodulation distortion according to one embodiment of the present disclosure;

FIG. 12 graphically illustrates constraints for determining a minimum separation between the first and second intermediate frequencies for predistortion when targeting third-order intermodulation distortion according to one embodiment of the present disclosure;

FIG. 13 graphically illustrates frequency band overlap when the separation between the first and second intermediate frequencies for predistortion is less than the minimum separation determined using the constraints illustrated in FIG. 12;

FIG. 14 graphically illustrates constraints for determining a minimum sampling rate for predistortion when targeting third-order intermodulation distortion according to one embodiment of the present disclosure;

FIG. 15 graphically illustrates the bandwidths of the frequency bands in the predistorted combined radio frequency signal prior to amplification by the power amplifier in the dual-band transmitter of FIG. 8 when targeting fifth-order intermodulation distortion according to one embodiment of the present disclosure;

FIG. 16 graphically illustrates constraints for determining a minimum separation between the first and second intermediate frequencies for predistortion when targeting fifth-order intermodulation distortion according to one embodiment of the present disclosure;

FIG. 17 graphically illustrates frequency band overlap when the separation between the first and second intermediate frequencies for predistortion is less than the minimum separation determined using the constraints illustrated in FIG. 16;

FIG. 18 graphically illustrates constraints for determining a minimum sampling rate for predistortion when targeting fifth-order intermodulation distortion according to one embodiment of the present disclosure;

FIG. 19 graphically illustrates the bandwidths of the frequency bands in the predistorted combined radio frequency signal prior to amplification by the power amplifier in the dual-band transmitter of FIG. 8 when targeting $(2k+1)$th-order intermodulation distortion according to one embodiment of the present disclosure;

FIG. 20 graphically illustrates constraints for determining a minimum separation between the first and second intermediate frequencies for predistortion when targeting $(2k+1)$th-order intermodulation distortion according to one embodiment of the present disclosure;

FIG. 21 graphically illustrates frequency band overlap when the separation between the first and second intermediate frequencies for predistortion is less than the minimum separation determined using the constraints illustrated in FIG. 20;

FIG. 22 graphically illustrates constraints for determining a minimum sampling rate for predistortion when targeting $(2k+1)$th-order intermodulation distortion according to one embodiment of the present disclosure;

FIG. 23 illustrates the dual-band transmitter of FIG. 8 according to another embodiment of the present disclosure; and FIG. 24 illustrates a method of performing digital predistortion in a dual-band transmitter according to one embodiment of the present disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Systems and methods for providing digital predistortion to compensate for a non-linearity of a power amplifier in a dual-band transmitter are disclosed. FIG. 8 illustrates an exemplary embodiment of a dual-band transmitter 58 according to one embodiment of the present disclosure. The dual-band transmitter 58 includes a first modem 60 that outputs a first baseband signal ($S_{BB1}$). Up-sampling circuitry 62 then up-samples the first baseband signal ($S_{BB1}$) to a predefined sampling rate for predistortion ($f_{S\_PD}$) to thereby provide a first up-sampled baseband signal ($S_{BB1\_US}$). Notably, the up-sampling circuitry 62 preferably performs both up-sampling and image filtering. Tuning circuitry 64 then tunes the first up-sampled baseband signal ($S_{BB1\_US}$) to a first intermediate frequency to provide a first intermediate frequency signal ($S_{IF1}$). In a similar manner, a second modem 66 outputs a second baseband signal ($S_{BB2}$). Up-sampling circuitry 68 then up-samples the second baseband signal ($S_{BB2}$) to the predefined sampling rate for predistortion ($f_{S\_PD}$) to thereby provide an second up-sampled baseband signal ($S_{BB2\_US}$). Notably, the up-sampling circuitry 68 preferably performs both up-sampling and image filtering. Tuning circuitry 70 then tunes the second up-sampled baseband signal ($S_{BB2\_US}$) to a second intermediate frequency to provide a second intermediate frequency signal ($S_{IF2}$).

In this embodiment, the first and second intermediate frequencies are $-f_{PD\_IF}$ and $f_{PD\_IF}$, respectively. In other words, the first intermediate frequency is a negative frequency, the second intermediate frequency is a positive frequency, and an absolute value of both the first and second intermediate frequencies is equal to $f_{PD\_IF}$. This is referred to herein as a symmetrical intermediate frequency embodiment. However, as discussed below, the dual-band transmitter 58 is not limited to the use of symmetrical intermediate frequencies. In another embodiment, asymmetrical intermediate frequencies may be used. The asymmetrical embodiment is discussed below with respect to FIG. 23.

The first and second intermediate frequency signals ($S_{IF1}$ and $S_{IF2}$) are combined, or summed, by a combiner 72 to provide a combined intermediate frequency signal ($S_{IF\_COMB}$). The combined intermediate frequency signal ($S_{IF\_COMB}$) is a dual-band signal having a first frequency band centered at the first intermediate frequency, a second frequency band centered at the second intermediate frequency, and no frequency components between the first and second frequency bands. Also, it should be noted that the combined intermediate frequency signal ($S_{IF\_COMB}$) is an equivalent baseband signal and is also a complex signal. A predistorter (PD) 74 then predistorts the combined intermediate frequency signal ($S_{IF\_COMB}$) to provide a predistorted signal ($S_{PD}$). More specifically, the predistorter 74 applies a predefined predistortion to the combined intermediate frequency signal ($S_{IF\_COMB}$) that compensates for a non-linearity of a power amplifier in the transmit chain. The predistortion cancels or substantially cancels a distortion caused by the non-linearity of the power amplifier in the transmit chain. Notably, the predistortion is performed at a predefined sampling rate for predistortion ($f_{S\_PD}$). As discussed below, in one embodiment of the present disclosure, the sampling rate for predistortion ($f_{S\_PD}$) is minimized to thereby reduce the complexity of the predistorter 74. It should be noted that the predistorter 74 simultaneously, or concurrently, performs predistortion for both of the first and second baseband signals ($S_{BB1}$ and $S_{BB2}$) and is therefore referred to herein as a dual-band predistorter. However, because the input of the predistorter 74 is a single input (i.e., a single dual-band signal input), the predistorter 74 may use any predistortion technique designed for a single band input (e.g., polynomial predistortion, predistortion using a neural network, or the like).

The predistorted signal ($S_{PD}$) is then provided to tuning circuitry 76 that operates to tune the frequency band in the predistorted signal ($S_{PD}$) that is centered at the first intermediate frequency, which in this embodiment is $-f_{IF\_PD}$, from the first intermediate frequency to baseband to thereby provide a first predistorted baseband signal ($S_{PD\_BB1}$). The first predistorted baseband signal ($S_{PD\_BB1}$) is then low-pass filtered by a filter 78 to remove unwanted frequency components (i.e., those frequency components that are outside of the frequency band centered at DC), thereby providing a first filtered predistorted baseband signal ($S_{PD\_BB1\_F}$). An up-converter 80 then up-converts the first filtered predistorted baseband signal ($S_{PD\_BB1\_F}$) from baseband to a first carrier frequency ($f_{C1}$) to thereby provide a first radio frequency signal ($S_{RF1}$). Notably, all of the processing up to the up-converter 80 is in the digital domain. As such, the up-converter 80 preferably also performs digital-to-analog conversion either at baseband or radio frequency, depending on the particular implementation.

In a similar manner, the predistorted signal ($Sp_D$) is also provided to tuning circuitry 82 that operates to tune the frequency band in the predistorted signal ($S_{PD}$) that is centered at the second intermediate frequency, which in this embodiment is $f_{IF\_PD}$, from the second intermediate frequency to baseband to thereby provide a second predistorted baseband signal ($Sp_{PD\_BB2}$). The second predistorted baseband signal ($S_{PD\_BB2}$) is then low-pass filtered by a filter 84 to remove unwanted frequency components (i.e., those frequency components that are outside of the frequency band centered at DC), thereby providing a second filtered predistorted baseband signal ($S_{PD\_BB2\_F}$). An up-converter 86 then up-converts the second filtered predistorted baseband signal ($S_{PD\_BB2\_F}$) from baseband to a second carrier frequency ($f_{C2}$) to thereby provide a second radio frequency signal ($S_{RF2}$). Notably, all of the processing up to the up-converter 86 is in the digital domain. As such, the up-converter 86 preferably also performs digital-to-analog conversion either at baseband or radio frequency, depending on the particular implementation.

A combiner 88 then combines, or sums, the first and second radio frequency signals ($S_{RF1}$ and $S_{RF2}$) to provide a combined radio frequency signal ($S_{RF\_COMB}$). The combined radio frequency signal ($S_{RF\_COMB}$) is a dual-band signal having a first frequency band centered at the first carrier frequency ($f_{C1}$), a second frequency band centered at the second carrier frequency ($f_{C2}$), and no frequency components between the first and second frequency bands. In addition, the combined radio frequency signal ($S_{RF\_COMB}$) is a predistorted signal. A power amplifier (PA) 90 then amplifies the combined radio frequency signal ($S_{RF\_COMB}$) to a desired output power level, thereby providing an amplified radio frequency signal ($S_{RF\_AMP}$). Lastly, a filter 92 removes out-of-band frequency components from the amplified radio frequency signal ($S_{RF\_AMP}$) to provide an output signal ($S_{OUT}$) to be transmitted by the dual-band transmitter 58. Specifically, the filter 92 removes any residual out-of-band distortion.

As discussed below in detail, in one embodiment, a separation between the first and second intermediate frequencies is carefully selected to be at or near a minimum separation value below which frequency bands in the predistorted signal ($S_{PD}$) for third-order and, in some embodiments, higher-order intermodulation distortion do not overlap frequency bands in the predistorted signal ($S_{PD}$) centered at the first and second intermediate frequencies. By doing so, the frequency bands remain separable while at the same time the sampling rate for predistortion ($f_{S\_PD}$) can be reduced. In addition to minimizing the separation between the first and second intermediate frequencies, the sampling rate for predistortion ($f_{S\_PD}$) may also be minimized by setting the sampling rate ($f_{S\_PD}$) equal to or near a minimum value below which frequency bands in the predistorted signal ($S_{PD}$) for third-order or, in some embodiments, higher-order intermodulation distortion alias into the frequency bands in the predistorted signal ($S_{PD}$) centered at the first and second intermediate frequencies. Notably, while in the preferred embodiment both the separation between the first and second intermediate frequencies and the sampling rate ($f_{S\_PD}$) are minimized, the separation between the first and second intermediate frequencies may be minimized without minimizing the sampling rate ($f_{S\_PD}$), and the sampling rate ($f_{S\_PD}$) may be minimized without minimizing the separation between the first and second intermediate frequencies.

The dual-band transmitter 58 also includes a feedback path including a filter 94 that filters the amplified radio frequency signal ($S_{RF\_AMP}$) from the output of the power amplifier 90 to remove any residual out-of-band distortion to provide a radio frequency feedback signal ($S_{FB\_RF}$). The radio frequency feedback signal ($S_{FB\_RF}$) is attenuated by an attenuator 96 to provide an attenuated radio frequency feedback signal ($S_{FB\_RF\_1/G}$). A down-converter 98 down-converts the attenuated radio frequency feedback signal ($S_{FB\_RF\_1/G}$) such that the frequency band centered at the first carrier frequency ($f_{C1}$) is now at baseband, thereby providing a first baseband feedback signal ($S_{FB\_BB1}$). A filter 100 then low-pass filters the first baseband feedback signal ($S_{FB\_BB1}$) to remove the unwanted frequency bands (i.e., the frequency bands other than that centered at DC). Tuning circuitry 102 then tunes the first baseband feedback signal ($S_{FB\_BB1}$) to the first intermediate frequency, which in this embodiment is $-f_{IF\_PD}$, thereby providing a first intermediate frequency feedback signal ($S_{FB\_IF1}$). The first intermediate frequency feedback signal ($S_{FB\_IF1}$) is a counter-part signal to the first intermediate frequency signal ($S_{IF1}$) in the forward path of the dual-band transmitter 58.

In a similar manner, a down-converter 104 down-converts the attenuated radio frequency feedback signal ($S_{FB\_RF\_1/G}$) such that the frequency band centered at the second carrier frequency ($f_{C2}$) is now at baseband, thereby providing a second baseband feedback signal ($S_{FB\_BB2}$). A filter 106 then low-pass filters the second baseband feedback signal ($S_{FB\_BB2}$) to remove the unwanted frequency bands (i.e., the frequency bands other than that centered at DC). Tuning circuitry 108 then tunes the second baseband feedback signal ($S_{FB\_BB2}$) to the second intermediate frequency, which in this embodiment is $f_{IF\_PD}$, thereby providing a second intermediate frequency feedback signal ($S_{FBIF2}$). The second intermediate frequency feedback signal ($S_{FB\_IF2}$) is a counter-part signal to the second intermediate frequency signal ($S_{IF2}$) in the forward path of the dual-band transmitter 58.

A combiner 110 then combines, or sums, the first and second intermediate frequency feedback signals ($S_{FB\_IF1}$ and $S_{FB\_IF2}$) to provide a combined intermediate frequency feedback signal ($S_{FB\_IF\_COMB}$). An adaptor 112 then dynamically configures the predistorter 74 based on the combined intermediate frequency feedback signal ($S_{FB\_IF\_COMB}$) and the combined intermediate frequency signal ($S_{IF\_COMB}$). Specifically, the adaptor 112 updates one or more predistortion parameters (e.g., polynomial coefficients defining a polynomial predistortion) using any suitable predistortion adaptation algorithm.

Figures 9A, 9B, 9C, 9D, 9E, 9F:
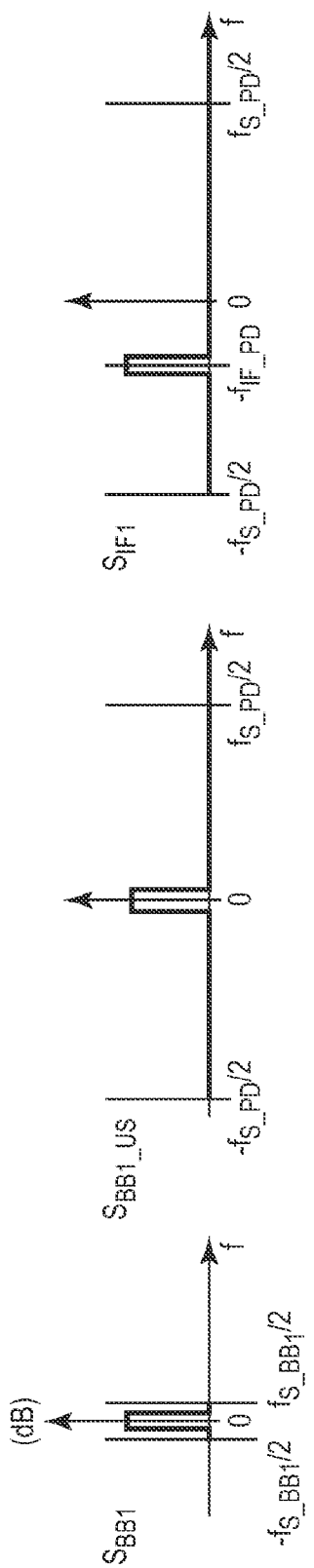
FIGS. 9A through 9Q are frequency band diagrams for the various signals in the forward path of the dual-band transmitter of FIG. 8 according to one embodiment of the present disclosure.
Figure 9G:
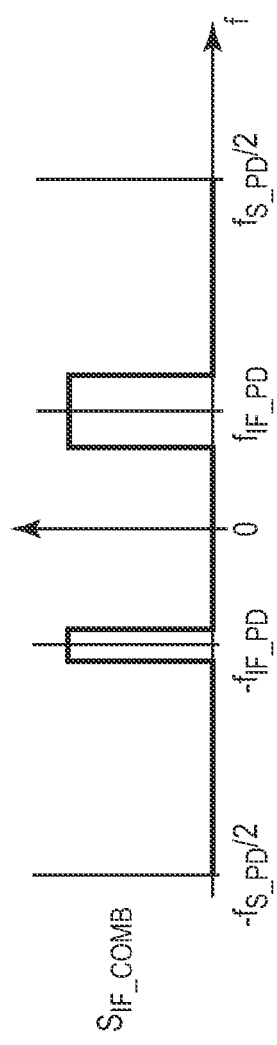
Figure 9H:
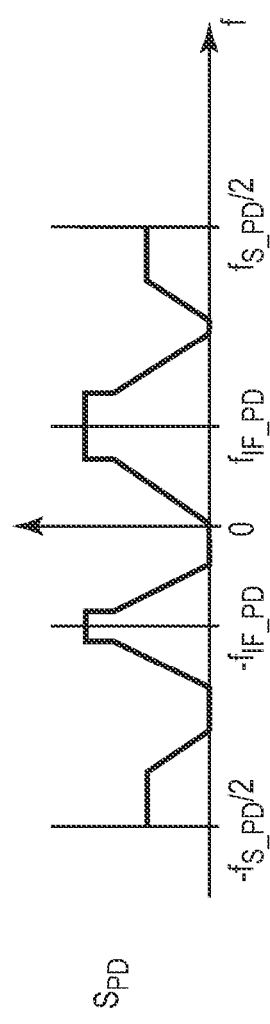
Figure 9I:
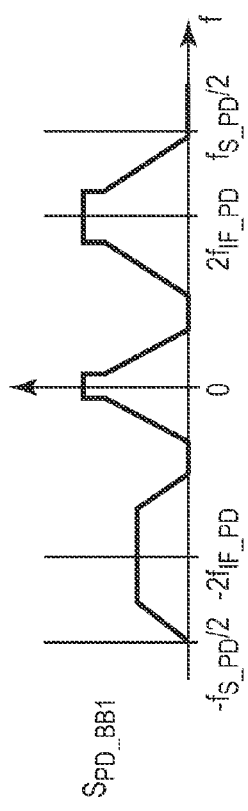
Figure 9J:
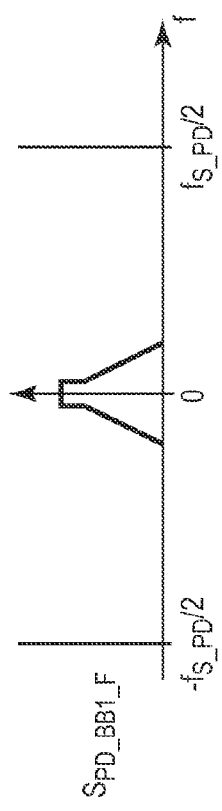
Figure 9K:
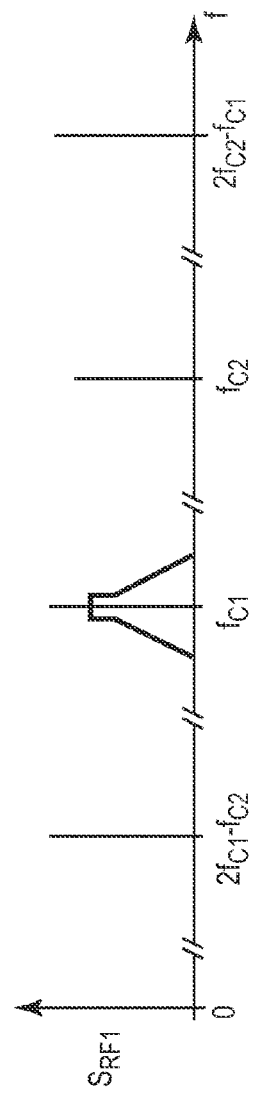
Figure 9L:
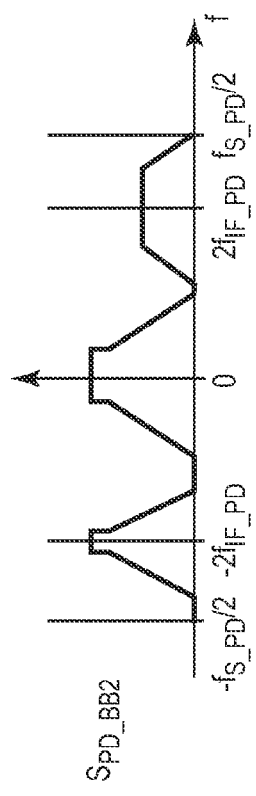
Figure 9M:
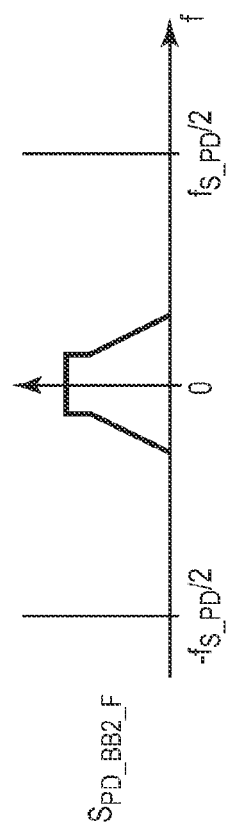
Figure 9N:
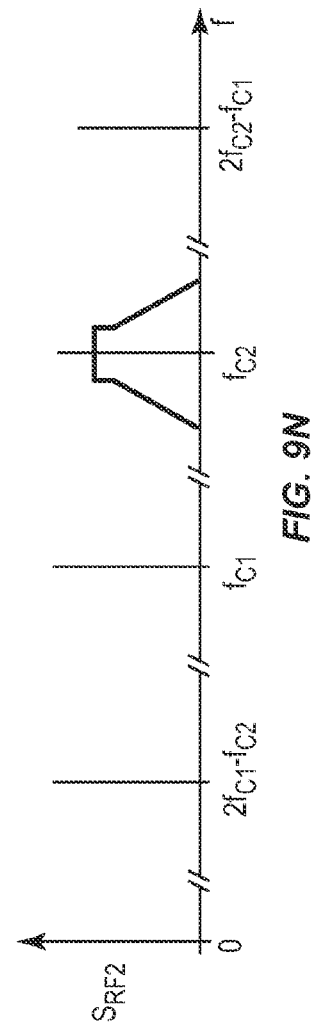
Figure 9O:
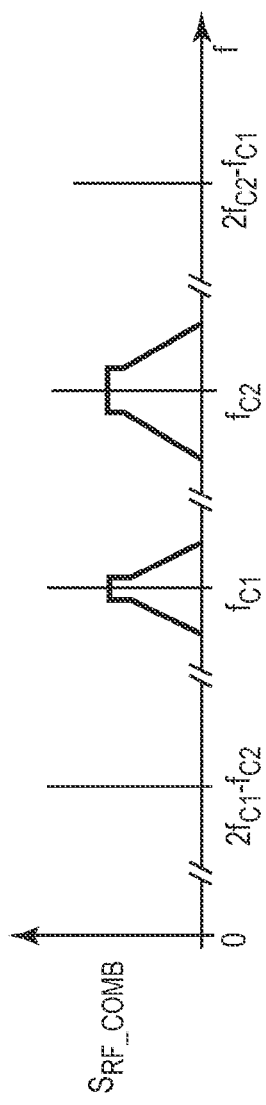
Figure 9P:
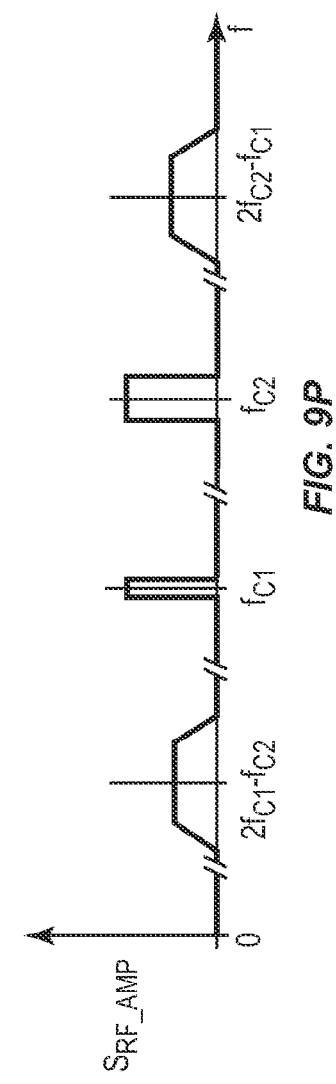
Figure 9Q:
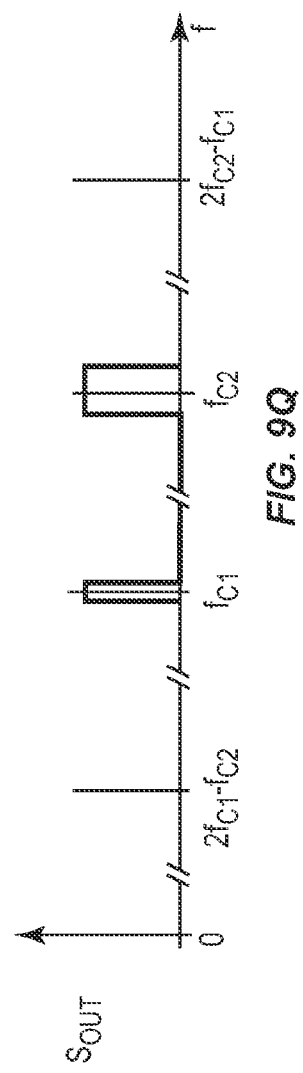

FIGS. 9A through 9Q are frequency band diagrams for the various signals in the forward path of the dual-band transmitter 58 of FIG. 8. Notably, in FIGS. 9A through 9Q the target intermodulation order for the predistortion is the third-order (i.e., IM3). However, it is to be appreciated that the target intermodulation order for the predistortion may be the (2k+1)th order where k is an integer greater than or equal to 1. FIG. 9A is a frequency band diagram for the first baseband signal ($S_{BB1}$). As shown, the sampling rate for the first baseband signal ($S_{BB1}$) is $f_{S\_BB1}$. FIG. 9B is a frequency band diagram for the first up-sampled baseband signal ($S_{BB1\_US}$). As shown, the sampling rate for the first up-sampled baseband signal ($S_{BB1\_US}$) is the sampling rate for predistortion ($f_{S\_PD}$). FIG. 9C is a frequency band diagram for the first intermediate frequency signal ($S_{IF1}$). As shown, the first intermediate frequency signal ($S_{IF1}$) is centered at the first intermediate frequency, which in this embodiment is $-f_{IF\_PD}$. In a similar manner, FIGS. 9D through 9F are frequency band diagrams for the second baseband signal ($S_{BB2}$), the second up-sampled baseband signal ($S_{BB2\_US}$), and the second intermediate frequency signal ($S_{IF2}$).

FIG. 9G is a frequency band diagram for the combined intermediate frequency signal ($S_{IF\_COMB}$). As shown, the combined intermediate frequency signal ($S_{IF\_COMB}$) is a dual-band signal having a first frequency band centered at the first intermediate frequency, which in this embodiment is $-f_{IF\_PD}$; a second frequency band centered at the second intermediate frequency, which in this embodiment is $f_{IF\_PD}$, and no frequency components between the first and second frequency bands. Also, the combined intermediate frequency signal ($S_{IF\_COMB}$) is an equivalent baseband signal and is also a complex signal. FIG. 9H is a frequency band diagram for the predistorted signal ($S_{PD}$). As illustrated, the predistortion results in a frequency-spreading effect for the frequency bands centered at the first and second intermediate frequencies.

FIG. 9I is a frequency band diagram for the first predistorted baseband signal ($S_{PD\_BB1}$) output by the tuning circuitry 76. As shown, the frequency band in the predistorted signal ($S_{PD}$) centered at the first intermediate frequency is now at baseband (i.e., centered at DC). FIG. 9J is a frequency band diagram for the first filtered predistorted baseband signal ($S_{PD\_BB1\_F}$). As shown, the first predistorted baseband signal ($S_{PD\_BB1}$) is low-pass filtered to remove the unwanted frequency components, which in this case are the frequency components other than those in the frequency band centered at DC. FIG. 9K is a frequency band diagram for the first radio frequency signal ($S_{RF1}$). As shown, the first filtered predistorted baseband signal ($S_{PD\_BB1\_F}$) is up-converted to the first carrier frequency ($f_{C1}$). In a similar manner, FIGS. 9L through 9N are frequency band diagrams for the second predistorted baseband signal ($S_{PD\_BB2}$), the second filtered predistorted baseband signal ($S_{PD\_BB2\_F}$), and the second radio frequency signal ($S_{RF2}$).

FIG. 9O is a frequency band diagram for the combined radio frequency signal ($S_{RF\_COMB}$) output by the combiner 88. As shown, the combined radio frequency signal ($S_{RF\_COMB}$) is a dual-band signal having a first frequency band centered at the first carrier frequency ($f_{C1}$), a second frequency band centered at the second carrier frequency ($f_{C2}$), and no frequency components between the first and second frequency bands. FIG. 9P is a frequency band diagram for the amplified radio frequency signal ($S_{RF\_AMP}$) output by the power amplifier 90. As shown, the predistortion for the frequency bands centered at the first and second carrier frequencies ($f_{C1}$ and $f_{C2}$) cancels the distortion caused by the non-linearity of the power amplifier 90 for the corresponding frequency bands. However, due to intermodulation distortion, residual out-of-band distortion remains in the frequency band centered at $2f_{C1}-f_{C2}$ and $2f_{C2}-f_{C1}$. This residual out-of-band distortion is removed by the filter 92 as shown in the frequency band diagram for the output signal ($S_{OUT}$) shown in FIG. 9Q.

Figure 10G:
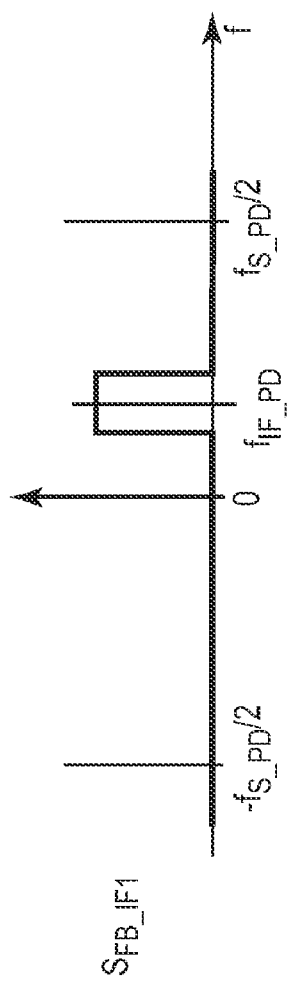

FIGS. 10A through 10H are frequency band diagrams for the various signals in the feedback path of the dual-band transmitter 58 of FIG. 8. Specifically, FIG. 10A is a frequency band diagram for the attenuated radio frequency feedback signal ($S_{FB\_RF\_1/G}$) output by the attenuator 96. FIG. 10B is a frequency band diagram for the first baseband feedback signal ($S_{FB\_BB1}$) output by the down-converter 98. As shown, the first baseband feedback signal ($S_{FB\_BB1}$) includes frequency components in a frequency band centered at DC as well as frequency components in a frequency band centered at $f_{C2}-f_{C1}$. After low-pass filtering by the filter 100, the resulting first filtered baseband feedback signal ($S_{FB\_BB1\_F}$) includes only the frequency components in the frequency band centered at DC, as illustrated in FIG. 10C. FIG. 10D is a frequency band diagram for the first intermediate frequency feedback signal ($S_{FB\_IF1}$) output by the tuning circuitry 102. As illustrated, the tuning circuitry 102 moves the frequency band centered at DC in the first filtered baseband feedback signal ($S_{FB\_BB1\_F}$) to the first intermediate frequency, which in this embodiment is $-f_{IF\_PD}$.

FIG. 10E is a frequency band diagram for the second baseband feedback signal ($S_{FB\_BB2}$) output by the down-converter 104. As shown, the second baseband feedback signal ($S_{FB\_BB2}$) includes frequency components in a frequency band centered at DC as well as frequency components in a frequency band centered at $-(f_{C2}-f_{C1})$. After low-pass filtering by the filter 106, the resulting second filtered baseband feedback signal ($S_{FB\_BB2\_F}$) includes only the frequency components in the frequency band centered at DC, as illustrated in FIG. 10F.

Figure 10H:
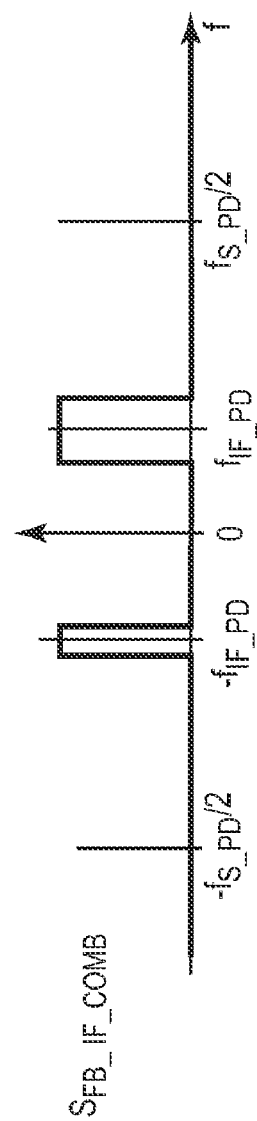

FIG. 10G is a frequency band diagram for the second intermediate frequency feedback signal ($S_{FB\_F2}$) output by the tuning circuitry 108. As illustrated, the tuning circuitry 108 moves the frequency band centered at DC in the second filtered baseband feedback signal ($S_{FB\_BB2\_F}$) to the second intermediate frequency, which in this embodiment is $f_{IF\_PD}$. Lastly, FIG. 10H is a frequency band diagram for the combined intermediate frequency feedback signal ($S_{FB\_IF\_COMB}$) output by the combiner 110.

Now that the dual-band transmitter 58 and the operation thereof have been described, attention will now turn to embodiments wherein the separation between the first and second intermediate frequencies and/or the sampling rate for predistortion ($f_{S\_PD}$) are minimized. FIGS. 11 through 14 graphically illustrate the manner in which the separation between the first and second intermediate frequencies and the sampling rate for predistortion can be minimized when targeting third-order intermodulation distortion (IM3). Specifically, FIG. 11 first illustrates the frequency bands in the combined radio frequency signal ($S_{RF\_COMB}$) when targeting third-order intermodulation distortion according to one embodiment of the present disclosure. As a result of the predistortion applied by the predistorter 74, frequency-band spreading has occurred for the primary frequency bands at the first and second carrier frequencies ($f_{C1}$ and $f_{C1}$). In addition, the combined radio frequency signal ($S_{RF\_COMB}$) includes frequency components in frequency bands centered at $2f_{C1}$-$f_{C2}$ and $2f_{C2}$-$f_{C1}$ due to intermodulation distortion.

The bandwidths of the frequency bands in the combined radio frequency signal ($S_{RF\_COMB}$) were determined using a four-tone analysis.

Specifically, the first and second baseband signals ($S_{BB1}$ and $S_{BB2}$) were each modeled by two tones. The first baseband signal ($S_{BB1}$) was modeled by a first tone on a left-most edge of the corresponding frequency band and a second tone on a right-most edge of the corresponding frequency band. Likewise, the second baseband signal ($S_{BB2}$) was modeled by a first tone on a left-most edge of the corresponding frequency band and a second tone on a right-most edge of the corresponding frequency band. Using this four-tone analysis, the bandwidth of the four frequency bands (referred to as frequency bands A through D) were determined as follows:

Frequency Band A: The bandwidth of the frequency band centered at the first carrier frequency ($f_{C1}$), which is referred to herein as frequency band A, has a bandwidth ($BW_{IM3\_A}$) defined as:

$$BW_{IM3\_A} = BW_1 + 2\max(BW_1, BW_2), \quad (1)$$

where $BW_1$ is a bandwidth of the first baseband signal ($S_{BB1}$) and $BW_2$ is a bandwidth of the second baseband signal ($S_{BB2}$);

Frequency Band B: The bandwidth of the frequency band centered at the second carrier frequency ($f_{D2}$), which is referred to herein as frequency band B, has a bandwidth ($BW_{IM3\_B}$) defined as:

$$BW_{IM3\_B} = BW_2 = BW_2 + 2\max(BW_1, BW_2); \quad (2)$$

Frequency Band C: The bandwidth of the frequency band centered at $2f_{C1}$-$f_{C2}$, which is referred to herein as frequency band C, has a bandwidth ($BW_{IM3\_C}$) defined as:

$$BW_{IM3\_C} = 2BW_1 + BW_2; \text{ and} \quad (3)$$

Frequency Band D: The bandwidth of the frequency band centered at $2f_{C2}$-$f_{C1}$, which is referred to herein as frequency band D, has a bandwidth ($BW_{IM3\_D}$) defined as:

$$BW_{IM3\_D} = BW_1 + 2BW_2. \quad (4)$$

FIG. 12 graphically illustrates the manner in which a minimum intermediate frequency value, $f_{IF\_PD\_MIN}$, is determined when targeting third-order intermodulation distortion based on the bandwidths of the frequency bands A through D according to one embodiment of the present disclosure. In this embodiment, the first and second intermediate frequencies are $-f_{IF\_PD}$ and $f_{IF\_PD}$, respectively. As such, when targeting third-order intermodulation distortion, the four frequency bands A through D in the predistorted signal ($S_{PD}$) output by the predistorter 74 are centered at $-f_{IF\_PD}$, $f_{IF\_PD}$, $-3f_{IF\_PD}$, and $3f_{IF\_PD}$, respectively. As illustrated, in order to maintain separation between the four frequency bands A through D, the following constraints must be met:

Constraint A: In order to maintain separation between frequency bands A and C, the following must be true:

$$2f_{IF\_PD\_MIN} \geq \frac{1}{2}(BW_{IM3\_C} + BW_{IM3\_A}). \quad (5)$$

Constraint B: In order to maintain separation between frequency bands A and B, the following must be true:

$$2f_{IF\_PD\_MIN} \geq \frac{1}{2}(BW_{IM3\_A} + BW_{IM3\_B}). \quad (6)$$

Constraint C: In order to maintain separation between frequency bands B and D, the following must be true:

$$2f_{IF\_PD\_MIN} \geq \frac{1}{2}(BW_{IM3\_B} + BW_{IM3\_D}). \quad (7)$$

From Equation (5)-Equation (7), $$f_{IF\_PD\_MIN} = \frac{1}{4}\max((BW_{IM3\_C} + BW_{IM3\_A}), (BW_{IM3\_A} + BW_{IM3\_B}), (BW_{IM3\_B} + BW_{IM3\_D})). \quad (8)$$

Substituting Equation (1)-Equation (4) into Equation (8) gives:

$$f_{IF\_PD\_MIN} = \frac{1}{4}BW_1 + \frac{1}{4}BW_2 + \max(BW_1, BW_2). \quad (9)$$

Further, if $BW_1 > BW_2$, Equation (9) takes the form:

$$f_{IF\_PD\_MIN} = \frac{1}{4}BW_1 + \frac{5}{4}BW_2. \quad (10)$$

Similarly, if $BW_1 = BW_2$, Equation (9) takes the form:

$$f_{IF\_PD\_MIN} = \frac{3}{2}BW_1. \quad (11)$$

Assuming a sufficiently large sampling rate for predistortion ($f_{S\_PD}$), the separation between the first and second intermediate frequencies can be minimized based on Equation (9)-Equation (11). More specifically, in this embodiment, the first and second intermediate frequencies are $-f_{IF\_PD}$ and $f_{IF\_PD}$, respectively. The separation between the first and second intermediate frequencies can therefore be minimized by setting $f_{IF\_PD}$ equal to or near the minimum intermediate frequency value ($f_{IF\_PD\_MIN}$) such that the separation between the first and second intermediate frequencies is at or near $2f_{IF\_PD\_MIN}$. More specifically, in one embodiment, the first intermediate frequency, which in this embodiment is $-f_{IF\_PD}$, is a frequency in the range of and including $-f_{IF\_PD\_MIN}$ and $-2f_{IF\_PD\_MIN}$, and the second intermediate frequency, which in this embodiment is $f_{IF\_PD}$, is a frequency in the range of and including $f_{IF\_PD\_MIN}$ and $2f_{IF\_PD\_MIN}$. In this manner, the separation between the first and second intermediate frequencies is in the range of and including $2f_{IF\_PD\_MIN}$ and $4f_{IF\_PD\_MIN}$.

In another embodiment, the first intermediate frequency, which in this embodiment is $-f_{IF\_PD}$, is a frequency equal to $-f_{IF\_PD\_MIN}$ minus a predefined guard band, and the second intermediate frequency, which in this embodiment is $f_{IF\_PD}$, is a frequency equal to $f_{IF\_PD\_MIN}$ plus the predefined guard band. The predefined guard band is a predetermined guard band of a size providing sufficient separation between the frequency bands A through D to allow proper filtering by the filters 78 and 84.

FIG. 13 is a frequency band diagram for the output of the predistorter 74 in a situation where the separation between the first and second intermediate frequencies is less than the minimum separation, which as discussed above is $2f_{IF\_PD\_MIN}$. As illustrated, there is overlap between frequency bands C and A, between frequency bands A and B, and between frequency bands B and D. This overlap degrades the performance of the dual-band transmitter 58 and, as such, is not desirable. As discussed above, in the preferred embodiment, the first and second intermediate frequencies are carefully selected such that the separation between the first and second intermediate frequencies is at or near the minimum separation, which is $2f_{IF\_PD\_MIN}$. In this manner, overlap between the frequency bands A through D is avoided, but, at the same time, the separation between the first and second intermediate frequencies is minimized. This minimization of the separation between the first and second intermediate frequencies reduces the sampling rate for predistortion ($f_{S\_PD}$), which in turn reduces the complexity of the predistorter 74.

FIG. 14 graphically illustrates the manner in which the sampling rate for predistortion ($f_{S\_PD}$) is minimized when targeting third-order intermodulation distortion (IM3) according to one embodiment of the present disclosure. In general, aliasing of the frequency components in the frequency bands A through D constrains minimization of the sampling rate for predistortion ($f_{S\_PD}$). Specifically, looking at FIG. 14, due to aliasing, a first image of the frequency bands A through D is centered at $-f_{S\_PD}$, and a second image of the frequency bands A through D is centered at $f_{S\_PD}$. A minimum sampling rate for predistortion ($f_{S\_PD\_MIN}$) is a sampling rate below which the frequency band D in the first image aliases into the frequency band A and the frequency band C in the second image aliases into the frequency band B. In other words, the constraints for the minimum sampling rate for predistortion ($f_{S\_PD\_MIN}$) are:

Constraint A: In order to prevent aliasing of the frequency band D into the frequency band A, the following must be true:

$$f_{s\_PD\_MIN} - 4f_{IF\_PD} \geq \frac{1}{2}(BW_{IM3\_D} + BW_{IM3\_A}). \qquad (12)$$

Constraint B: In order to prevent aliasing of the frequency band C into the frequency band B, the following must be true:

$$f_{s\_PD\_MIN} - 4f_{IF\_PD} \geq \frac{1}{2}(BW_{IM3\_C} + BW_{IM3\_B}). \qquad (13)$$

From Equation (12) and Equation (13), $$f_{s\_PD\_MIN} = \qquad (14)$$
$$4f_{IF\_PD} + \frac{1}{2}\max((BW_{IM3\_D} + BW_{IM3\_A}), (BW_{IM3\_C} + BW_{IM3\_B}))$$

Substituting Equation (1)-Equation (4) into Equation (14) gives:

$$f_{S\_PD\_MIN} = 4f_{IF\_PD} + BW_1 + BW_2 + \max(BW_1, BW_2). \qquad (15)$$

If $f_{IF\_PD} = f_{IF\_PD\_MIN}$, Equation (15) takes the form:

$$f_{S\_PD\_MIN} = 2BW_1 + 2BW_2 + 5\max(BW_1, BW_2). \qquad (16)$$

Further, if $BW_1 > BW_2$, Equation (16) takes the form:

$$f_{S\_PD\_MIN} = 2BW_1 + 7BW_2. \qquad (17)$$

Similarly, if $BW_1 = BW_2$, Equation (16) takes the form:

$$f_{S\_PD\_MIN} = 9BW_1. \qquad (18)$$

The sampling rate for predistortion ($f_{s\_PD}$) when targeting third-order intermodulation distortion can be minimized based on Equation (15)-Equation (18). More specifically, in one embodiment, the sampling rate for predistortion ($f_{s\_PD}$) is set equal to or near the minimum sampling rate for predistortion ($f_{s\_PD\_MIN}$). In one particular embodiment, the sampling rate for predistortion ($f_{S\_PD}$) is set to a sampling rate in the range of and including $f_{S\_PD\_MIN}$ and $2f_{S\_PD\_MIN}$. In this manner, aliasing of the frequency band C in the second image into the frequency band B and aliasing of the frequency band D in the first image into the frequency band A is avoided.

FIGS. 15 through 18 graphically illustrate the manner in which the separation between the first and second intermediate frequencies and the sampling rate for predistortion can be minimized when targeting fifth-order intermodulation distortion (IM5). Specifically, FIG. 15 first illustrates the frequency bands in the combined radio frequency signal ($S_{RF\_COMB}$) when targeting fifth-order intermodulation distortion according to one embodiment of the present disclosure. As a result of the predistortion applied by the predistorter 74, frequency-band spreading has occurred for the primary frequency bands at the first and second carrier frequencies ($f_{C1}$ and $f_{C1}$). In addition, the combined radio frequency signal ($S_{RF\_COMB}$) includes frequency components in frequency bands centered at $2f_{C1}-f_{C2}$, $2f_{C2}-f_{C1}$, $3f_{C1}-2f_{C2}$, and $3f_{C2}-2f_{C1}$ due to intermodulation distortion.

The bandwidths of the frequency bands in the combined radio frequency signal ($S_{RF\_COMB}$) were determined using a four-tone analysis. Specifically, the first and second baseband signals ($S_{BB1}$ and $S_{BB2}$) were each modeled by two tones. The first baseband signal ($S_{BB1}$) was modeled by a first tone on a left-most edge of the corresponding frequency band and a second tone on a right-most edge of the corresponding frequency band. Likewise, the second baseband signal ($S_{BB2}$) was modeled by a first tone on a left-most edge of the corresponding frequency band and a second tone on a right-most edge of the corresponding frequency band. Using this four-tone analysis, the bandwidth of the six frequency bands (referred to as frequency bands A through F) were determined as follows:

Frequency Band A: The bandwidth of the frequency band centered at the first carrier frequency ($f_{C1}$), which is referred to herein as frequency band A, has a bandwidth ($BW_{IM5\_A}$) defined as:

$$BW_{IM5\_A} = BW_1 + 4\max(BW_1, BW_2), \quad (19)$$

where $BW_1$ is a bandwidth of the first baseband signal ($S_{BB1}$) and $BW_2$ is a bandwidth of the second baseband signal ($S_{BB2}$);

Frequency Band B: The bandwidth of the frequency band centered at the second carrier frequency ($f_{C2}$), which is referred to herein as frequency band B, has a bandwidth ($BW_{IM5\_B}$) defined as:

$$BW_{IM5\_B} = BW_2 + 4\max(BW_1, BW_2); \quad (20)$$

Frequency Band C: The bandwidth of the frequency band centered at $2f_{C1} - f_{C2}$, which is referred to herein as frequency band C, has a bandwidth ($BW_{IM5\_C}$) defined as:

$$BW_{IM5\_C} = 2BW_1 + BW_2 + 2\max(BW_1, BW_2); \quad (21)$$

Frequency Band D: The bandwidth of the frequency band centered at $2f_{C2} - f_{C1}$, which is referred to herein as frequency band D, has a bandwidth ($BW_{IM5\_D}$) defined as:

$$BW_{IM5\_D} = BW_1 + 2BW_2 + 2\max(BW_1, BW_2); \quad (22)$$

Frequency Band E: The bandwidth of the frequency band centered at $3f_{D1} - 2f_{D2}$, which is referred to herein as frequency band E, has a bandwidth ($BW_{IM5\_E}$) defined as:

$$BW_{IM5\_E} = 3BW_1 + 2BW_2; \text{ and} \quad (23)$$

Frequency Band F: The bandwidth of the frequency band centered at $3f_{D2} - 2f_{D1}$, which is referred to herein as frequency band F, has a bandwidth ($BW_{IM5\_F}$) defined as:

$$BW_{IM5\_F} = 2BW_1 + 3BW_2. \quad (24)$$

FIG. 16 graphically illustrates the manner in which a minimum intermediate frequency value, $f_{IF\_PD\_MIN}$, is determined when targeting fifth-order intermodulation distortion based on the bandwidths of the frequency bands A through F according to one embodiment of the present disclosure. In this embodiment, the first and second intermediate frequencies are $-f_{IF\_PD}$ and $f_{IF\_PD}$, respectively. As such, when targeting fifth-order intermodulation distortion, the six frequency bands A through F in the predistorted signal ($S_{PD}$) output by the predistorter 74 are centered at $-f_{IF\_PD}$, $f_{IF\_PD}$, $-3f_{IF\_PD}$, $3f_{IF\_PD}$, $-5f_{IF\_PD}$, and $5f_{IF\_PD}$, respectively. As illustrated, in order to maintain separation between the six frequency bands A through F, the following constraints must be met:

Constraint A: In order to maintain separation between frequency bands A and C, the following must be true:

$$2f_{IF\_PD\_MIN} \geq \frac{1}{2}(BW_{IM5\_C} + BW_{IM5\_A}). \quad (25)$$

Constraint B: In order to maintain separation between frequency bands A and B, the following must be true:

$$2f_{IF\_PD\_MIN} \geq \frac{1}{2}(BW_{IM5\_A} + BW_{IM5\_B}). \quad (26)$$

Constraint C: In order to maintain separation between frequency bands B and D, the following must be true:

$$2f_{IF\_PD\_MIN} \geq \frac{1}{2}(BW_{IM5\_B} + BW_{IM5\_D}). \quad (27)$$

Notably, there are no constraints for the separation between the frequency bands E and C and the frequency bands D and F because overlap between these frequency bands is of no concern. Only overlap with the primary frequency bands, or useable, frequency bands A and B is of concern.

From Equation (25)-Equation (27), $$f_{IF\_PD\_MIN} = \frac{1}{4}\max((BW_{IM5\_C} + BW_{IM5\_A}), \quad (28)$$
$$(BW_{IM5\_A} + BW_{IM5\_B}), (BW_{IM5\_B} + BW_{IM5\_D})).$$

Substituting Equation (19)-Equation (22) into Equation (28) gives:

$$f_{IF\_PD\_MIN} = \frac{1}{4}BW_1 + \frac{1}{4}BW_2 + 2\max(BW_1, BW_2). \quad (29)$$

Further, if $BW_1 \geq BW_2$, Equation (29) takes the form:

$$f_{IF\_PD\_MIN} = \frac{1}{4}BW_1 + \frac{9}{4}BW_2. \quad (30)$$

Similarly, if $BW_1 = BW_2$, Equation (29) takes the form:

$$f_{IF\_PD\_MIN} = \frac{5}{2}BW_1. \quad (31)$$

Assuming a sufficiently large sampling rate for predistortion ($f_{S\_PD}$), the separation between the first and second intermediate frequencies can be minimized based on Equation (29)-Equation (31). More specifically, in this embodiment, the first and second intermediate frequencies are $-f_{IF\_PD}$ and $f_{IF\_PD}$, respectively. The separation between the first and second intermediate frequencies can therefore be minimized by setting $f_{IF\_PD}$ equal to or near the minimum intermediate frequency value ($f_{IF\_PD\_MIN}$) such that the separation between the first and second intermediate frequencies is at or near $2f_{IF\_PD\_MIN}$. More specifically, in one embodiment, the first intermediate frequency, which in this embodiment is $-f_{IF\_PD}$, is a frequency in the range of and including $-f_{IF\_PD\_MIN}$ and $-2f_{IF\_PD\_MIN}$, and the second intermediate frequency, which in this embodiment is $f_{IF\_PD}$, is a frequency in the range of and including $f_{IF\_PD\_MIN}$ and $2f_{IF\_PD\_MIN}$. In this manner, the separation between the first and second intermediate frequencies is in the range of and including $2f_{IF\_PD\_MIN}$ and $4f_{IF\_PD\_MIN}$.

In another embodiment, the first intermediate frequency, which in this embodiment is $-f_{IF\_PD}$, is a frequency equal to $-f_{IF\_PD\_MIN}$ minus a predefined guard band, and the second intermediate frequency, which in this embodiment is $f_{IF\_PD}$, is a frequency equal to $f_{IF\_PD\_MIN}$ plus the predefined guard band. The predefined guard band is a predetermined guard band of a size providing sufficient separation between the frequency bands A through D to allow proper filtering by the filters 78 and 84.

FIG. 17 is a frequency band diagram for the output of the predistorter 74 in a situation where the separation between the first and second intermediate frequencies is less than the minimum separation, which as discussed above is $2f_{IF\_PD\_MIN}$. As illustrated, there is overlap between frequency bands C and A, between frequency bands A and B, and between frequency bands B and D. This overlap degrades the performance of the dual-band transmitter 58 and, as such, is not desirable. Notably, the overlap between frequency bands E and C and between frequency bands D and F is of no concern. Rather, only the overlaps involving the primary, or usable, frequency bands A and B are of concern. As discussed above, in the preferred embodiment, the first and second intermediate frequencies are carefully selected such that the separation between the first and second intermediate frequencies is at or near the minimum separation, which is $2f_{IF\_PD\_MIN}$. In this manner, overlap between the frequency bands A through D is avoided, but, at the same time, the separation between the first and second intermediate frequencies is minimized This minimization of the separation between the first and second intermediate frequencies reduces the sampling rate for predistortion ($f_{S\_PD}$), which reduces the complexity of the predistorter 74.

FIG. 18 graphically illustrates the manner in which the sampling rate for predistortion ($f_{S\_PD}$) is minimized when targeting fifth-order intermodulation distortion (IM5) according to one embodiment of the present disclosure. In general, aliasing of the frequency components in the frequency bands A through F constrains minimization of the sampling rate for predistortion ($f_{S\_PD}$). Specifically, looking at FIG. 18, due to aliasing, a first image of the frequency bands A through F is centered at $-f_{S\_PD}$, and a second image of the frequency bands A through F is centered at $f_{S\_PD}$. The minimum sampling rate for predistortion ($f_{S\_PD\_MIN}$) is a frequency below which the frequency band F in the first image aliases into the frequency band A and the frequency band E in the second image aliases into the frequency band B. In other words, the constraints for the minimum sampling rate for predistortion ($f_{S\_PD\_MIN}$) are:

Constraint A: In order to prevent aliasing of the frequency band F into the frequency band A, the following must be true:

$$f_{S\_PD\_MIN} - 6f_{IF\_PD} \geq \frac{1}{2}(BW_{IM5\_F} + BW_{IM5\_A}). \quad (32)$$

Constraint B: In order to prevent aliasing of the frequency band E into the frequency band B, the following must be true:

$$f_{S\_PD\_MIN} - 6f_{IF\_PD} \geq \frac{1}{2}(BW_{IM5\_E} + BW_{IM5\_B}). \quad (33)$$

From Equation (32) and Equation (33), $$f_{S\_PD\_MIN} = \quad (34)$$
$$6f_{IF\_PD} + \frac{1}{2}\max((BW_{IM5\_F} + BW_{IM5\_A}), (BW_{IM5\_E} + BW_{IM5\_B}))$$

Substituting Equation (19)-Equation (24) into Equation (34) gives:

$$f_{S\_PD\_MIN} = 6f_{IF\_PD} + \frac{3}{2}BW_1 + \frac{3}{2}BW_2 + 2\max(BW_1, BW_2). \quad (35)$$

If $f_{IF\_PD} = f_{IF\_PD\_MIN}$, Equation (35) takes the form:

$$f_{S\_PD\_MIN} = 3BW_1 + 3BW_2 + 14\max(BW_1, BW_2). \quad (36)$$

Further, if $BW_1 \geq BW_2$, Equation (36) takes the form:

$$f_{S\_PD\_MIN} 3BW_1 + 17BW_2. \quad (37)$$

Similarly, if $BW_1 = BW_2$, Equation (36) takes the form:

$$f_{S\_PD\_MIN} = 20BW_1. \quad (38)$$

The sampling rate for predistortion ($f_{S\_PD}$) when targeting fifth-order intermodulation distortion can be minimized based on Equation (35)-Equation (38). More specifically, in one embodiment, the sampling rate for predistortion ($f_{S\_PD}$) is set equal to or near the minimum sampling rate for predistortion ($f_{S\_PD\_MIN}$). In one particular embodiment, the sampling rate for predistortion ($f_{S\_PD}$) is set to a sampling rate in the range of and including $f_{S\_PD\_MIN}$ and $2f_{S\_PD\_MIN}$. In this manner, aliasing of the frequency band E in the second image into the frequency band B and aliasing of the frequency band F in the first image into the frequency band A is avoided.

FIGS. 19 through 22 graphically illustrate the manner in which the separation between the first and second intermediate frequencies and the sampling rate for predistortion can be minimized when targeting (2k+1)th-order intermodulation distortion where k is an integer greater than or equal to 1. In other words, FIGS. 19 through 22 are a generalization for targeting any desired order of intermodulation distortion. Specifically, FIG. 19 first illustrates the frequency bands in the combined radio frequency signal ($S_{RF\_COMB}$) when targeting the (2k+1)th order intermodulation distortion according to one embodiment of the present disclosure. As a result of the predistortion applied by the predistorter 74, frequency-band spreading has occurred for the primary frequency bands at the first and second carrier frequencies ($f_{C1}$ and $f_{C2}$). In addition, the combined radio frequency signal ($S_{RF\_COMB}$) includes frequency components in frequency bands centered at $2f_{C1}-f_{C2}$, $2f_{D2}-f_{C1}$, ..., $kf_{C1}-(k-1)f_{C2}$, $kf_{C2}-(k-1)f_{C1}$, $(k+1)f_{C1}-kf_{C2}$, and $(k+1)f_{C2}-kf_{C1}$ due to intermodulation distortion.

The bandwidths of the frequency bands in the combined radio frequency signal ($S_{RF\_COMB}$) were determined using a four-tone analysis. Specifically, the first and second baseband signals ($S_{BB1}$ and $S_{BB2}$) were each modeled by two tones. The first baseband signal ($S_{BB1}$) was modeled by a first tone on a left-most edge of the corresponding frequency band and a second tone on a right-most edge of the corresponding frequency band. Likewise, the second baseband signal ($S_{BB2}$) was modeled by a first tone on a left-most edge of the corresponding frequency band and a second tone on a right-most edge of the corresponding frequency band. Using this four-tone analysis, the bandwidth of the frequency bands (referred to as frequency bands 1 through 2k+2) were determined to be:

Frequency Band $2i+1$ centered at $(i+1)f_{C1}-if_{C2}$:

$$BW_{IM(2k+1)\_(2i+1)} = (i+1)BW_1 + iBW_2 + 2(k-i)\cdot\max(BW_1, BW_2), \quad (39)$$

where i is an integer greater than or equal to 0, $BW_1$ is a bandwidth of the first baseband signal ($S_{BB1}$), and $BW_2$ is a bandwidth of the second baseband signal ($S_{BB2}$).

Frequency Band $2i+2$ centered at $(i+1)f_{C2}-if_{C1}$:

$$BW_{IM(2k+1)\_(2i+2)} = (i+1)BW_2 + iBW_1 + 2(k-i) \cdot \max(BW_1, BW_2). \quad (40)$$

FIG. 20 graphically illustrates the manner in which a minimum intermediate frequency value, $f_{IF\_PD\_MIN}$, is determined when targeting the $(2k+1)$th-order intermodulation distortion based on the bandwidths of the frequency bands 1 through $2k+2$ according to one embodiment of the present disclosure. In this embodiment, the first and second intermediate frequencies are $4_{IF\_PD}$ and $f_{IF\_PD}$, respectively. As such, when targeting the $(2k+1)$th-order intermodulation distortion, the frequency bands in the predistorted signal $(S_{PD})$ output by the predistorter 74 are centered at $\pm f_{IF\_PD}$, $\pm 3f_{IF\_PD}$, $\pm 5f_{IF\_PD}$, etc. As illustrated, in order to maintain separation between the frequency bands, the following constraints must be met:

Constraint A: In order to maintain separation between frequency bands 1 and 3, the following must be true:

$$2f_{IF\_PD\_MIN} \geq \frac{1}{2}(BW_{IM(2k+1)\_03} + BW_{IM(2k+1)\_01}). \quad (41)$$

Constraint B: In order to maintain separation between frequency bands 1 and 2, the following must be true:

$$2f_{IF\_PD\_MIN} \geq \frac{1}{2}(BW_{IM(2k+1)\_01} + BW_{IM(2k+1)\_02}). \quad (42)$$

Constraint C: In order to maintain separation between frequency bands 2 and 4, the following must be true:

$$2f_{IF\_PD\_MIN} \geq \frac{1}{2}(BW_{IM(2k+1)\_02} + BW_{IM(2k+1)\_04}). \quad (43)$$

Notably, there are no constraints for the separation between the other frequency bands because overlap between these frequency bands is of no concern. Only overlap with the primary, or useable, frequency bands 1 and 2 is of concern.

From Equation (41)-Equation (43), $$f_{IF\_PD\_MIN} = \frac{1}{4}\max((BW_{IM(2k+1)\_03} + BW_{IM(2k+1)\_01}), \quad (44)$$
$$(BW_{IM(2k+1)\_01} + BW_{IM(2k+1)\_02}),$$
$$(BW_{IM(2k+1)\_02} + BW_{IM(2k+1)\_04}))$$

Substituting Equation (39)-Equation (40) into Equation (44) gives:

$$f_{IF\_PD\_MIN} = \frac{1}{4}BW_1 + \frac{1}{4}BW_2 + k \cdot \max(BW_1, BW_2). \quad (45)$$

Further, if $BW_1 \geq BW_2$, Equation (45) takes the form:

$$f_{IF\_PD\_MIN} = \frac{1}{4}BW_1 + \left(k + \frac{1}{4}\right)BW_2. \quad (46)$$

Similarly, if $BW_1 = BW_2$, Equation (45) takes the form:

$$f_{IF\_PD\_MIN} = \left(k + \frac{1}{2}\right)BW_1. \quad (47)$$

Assuming a sufficiently large sampling rate for predistortion $(f_{S\_D})$, the separation between the first and second intermediate frequencies can be minimized based on Equation (44)-Equation (47). More specifically, in this embodiment, the first and second intermediate frequencies are $-f_{IF\_PD}$ and $f_{IF\_PD}$, respectively. The separation between the first and second intermediate frequencies can therefore be minimized by setting $f_{IF\_PD}$ equal to or near the minimum intermediate frequency value $(f_{IF\_PD\_MIN})$ such that the separation between the first and second intermediate frequencies is at or near $2f_{IF\_PD\_MIN}$. More specifically, in one embodiment, the first intermediate frequency, which in this embodiment is $-f_{IF\_PD}$, is a frequency in the range of and including $-f_{IF\_PD\_MIN}$ and $-2f_{IF\_PD\_MIN}$, and the second intermediate frequency, which in this embodiment is $f_{IF\_PD}$, is a frequency in the range of and including $f_{IF\_PD\_MIN}$ and $2f_{IF\_PD\_MIN}$. In this manner, the separation between the first and second intermediate frequencies is in the range of and including $2f_{IF\_PD\_MIN}$ and $4f_{IF\_PD\_MIN}$.

In another embodiment, the first intermediate frequency, which in this embodiment is $-f_{IF\_PD}$, is a frequency equal to $-f_{IF\_PD\_MIN}$ minus a predefined guard band, and the second intermediate frequency, which in this embodiment is $f_{IF\_PD}$, is a frequency equal to $f_{IF\_PD\_MIN}$ plus the predefined guard band. The predefined guard band is a predetermined guard band of a size providing sufficient separation between the frequency bands 1 through 4 to allow proper filtering by the filters 78 and 84.

FIG. 21 is a frequency band diagram for the output of the predistorter 74 when targeting the $(2k+1)$th-order intermodulation distortion in a situation where the separation between the first and second intermediate frequencies is less than the minimum separation, which as discussed above is $2f_{IF\_PD\_MIN}$. As illustrated, there is overlap between frequency bands 3 and 1, between frequency bands 1 and 2, and between frequency bands 2 and 4. This overlap degrades the performance of the dual-band transmitter 58 and, as such, is not desirable. Notably, the overlap between the other frequency bands (e.g., overlap between frequency bands 5 and 3 and between frequency bands 4 and 6) is of no concern. Rather, only the overlaps involving the primary, or usable, frequency bands 1 and 2 are of concern. As discussed above, in the preferred embodiment, the first and second intermediate frequencies are carefully selected such that the separation between the first and second intermediate frequencies is at or near the minimum separation, which is $2f_{IF\_PD\_MIN}$. In this manner, overlap between the frequency bands 1 through 4 is avoided, but, at the same time, the separation between the first and second intermediate frequencies is minimized. This minimization of the separation between the first and second intermediate frequencies reduces the sampling rate for predistortion $(f_{S\_PD})$, which reduces the complexity of the predistorter 74.

FIG. 22 graphically illustrates the manner in which the sampling rate for predistortion $(f_{S\_PD})$ is minimized when targeting the $(2k+1)$th-order intermodulation distortion according to one embodiment of the present disclosure. In general, aliasing of the frequency components in the frequency bands 1 through $2k+2$ constrains minimization of the sampling rate for predistortion $(f_{S\_PD})$. Specifically, looking at FIG. 22, due to aliasing, a first image of the frequency bands 1 through $2k+2$ is centered at $-f_{S\_PD}$, and a second image of the frequency bands 1 through $2k+2$ is centered at $f_{S\_PD}$. The minimum sampling rate for predistortion ($f_{S\_PD\_MIN}$) is a frequency below which the frequency band $2k+2$ in the first image aliases into the frequency band 1 and the frequency band $2k+1$ in the second image aliases into the frequency band 2. In other words, the constraints for the minimum sampling rate for predistortion ($f_{S\_PD\_MIN}$) are:

Constraint A: In order to prevent aliasing of the frequency band $2k+2$ into the frequency band 1, the following must be true:

$$f_{S\_PD\_MIN} - (2k+2)f_{IF\_PD} \geq \frac{1}{2}(BW_{IM(2k+1)\_(2k+2)} + BW_{IM(2k+1)\_01}). \quad (48)$$

Constraint B: In order to prevent aliasing of the frequency band $2k+1$ into the frequency band 2, the following must be true:

$$f_{S\_PD\_MIN} - (2k+2)f_{IF\_PD} \geq \frac{1}{2}(BW_{IM(2k+1)\_(2k+1)} + BW_{IM(2k+1)\_02}). \quad (49)$$

From Equation (48) and Equation (49), $$f_{S\_PD\_MIN} = \qquad (50)$$
$$(2k+2)f_{IF\_PD} + \frac{1}{2}\max((BW_{IM(2k+1)\_(2k+2)} + BW_{IM(2k+1)\_01}),$$
$$(BW_{IM(2k+1)\_(2k+1)} + BW_{IM(2k+1)\_02}))$$

Substituting Equation (39)-Equation (40) into Equation (50) gives:

$$f_{S\_PD\_MIN} = \qquad (51)$$
$$(2k+2)f_{IF\_PD} + \frac{k+1}{2}BW_1 + \frac{k+1}{2}BW_2 + k \cdot \max(BW_1, BW_2).$$

If $f_{IF\_PD} = f_{IF\_PD\_MIN}$, Equation (51) takes the form:

$$f_{S\_PD\_MIN} = (k+1)BW_1 + (k+1)BW_2 + (2k+3)k \cdot \max(BW_1, BW_2). \quad (52)$$

Further, if $BW_1 \geq BW_2$, Equation (52) takes the form:

$$f_{S\_PD\_MIN} = (k+1)BW_1 + (2k^2 4k+1)BW_2. \quad (53)$$

Similarly, if $BW_1 = BW_2$, Equation (52) takes the form:

$$f_{S\_PD\_MIN} = (2k^2 5k+2)BW_1 = (k+2)(2k+1)BW_1. \quad (54)$$

The sampling rate for predistortion ($f_{S\_PD}$) when targeting the $(2k+1)$th-order intermodulation distortion can be minimized based on Equation (50)-Equation (54). More specifically, in one embodiment, sampling rate for predistortion ($f_{S\_PD}$) is set equal to or near the minimum sampling rate for predistortion ($f_{S\_PD\_MIN}$). In one particular embodiment, the sampling rate for predistortion ($f_{S\_PD}$) is set to a sampling rate in the range of and including $f_{S\_PD\_MIN}$ and $2f_{S\_PD\_MIN}$. In this manner, aliasing of the frequency band $(2k+2)$ in the second image into the frequency band 1 and aliasing of the frequency band $(2k+1)$ in the first image into the frequency band 2 is avoided.

While the discussion above has been focused on the symmetrical intermediate frequency embodiment, the present disclosure is not limited thereto. FIG. 23 illustrates an asymmetrical intermediate frequency embodiment of the dual-band transmitter 58 of FIG. 8, which is referred to as dual-band transmitter 58'. Specifically, in this embodiment, the tuning circuitry 64 tunes the first up-sampled baseband signal ($S_{BB1\_US}$) to the first intermediate frequency, which in this embodiment is $f_{IF\_PD\_1}$. Similarly, the tuning circuitry 70 tunes the second up-sampled baseband signal ($S_{BB2\_US}$) to the second intermediate frequency, which in this embodiment is $f_{IF\_PD\_2}$. In this embodiment, the first intermediate frequency is defined as:

$$f_{IF\_PD\_1} = -f_{IF\_PD} + f_{IF\_PD\_OFFSET}, \quad (55)$$

where $f_{IF\_PD\_OFFSET}$ is a predefined frequency offset. Similarly, the second intermediate frequency is defined as:

$$f_{IF\_PD\_2} = f_{IF\_PD} + f_{IF\_PD\_OFFSET}. \quad (56)$$

The frequency offset ($f_{IF\_PD\_OFFSET}$) can take any value, but practically, due to sampling at $f_{S\_PD}$, any value for the frequency offset ($f_{IF\_PD\_OFFSET}$) outside of the range $-f_{S\_PD}/2$ to $f_{S\_PD}/2$ will have the same effect as a value that equals $f_{IF\_PD\_OFFSET} + i \cdot f_{S\_PD}$, where i is an integer. A non-zero frequency offset ($f_{IF\_PD\_OFFSET}$) results in a circular shift in the frequency domain within the $-f_{S\_PD}/2$ to $f_{S\_PD}/2$ window, therefore, $f_{S\_PD}$ is independent of the value of $f_{IF\_PD\_OFFSET}$, and all the results described above with respect to the symmetrical intermediate frequency embodiment still apply. Note that the symmetrical intermediate frequency embodiment is a special case where $f_{IF\_PD\_OFFSET} = 0$.

In Equations (55) and (56), $f_{IF\_PD}$ is the intermediate frequency for predistortion ($f_{IF\_PD}$) and is exactly the same as that discussed above with respect to the symmetrical intermediate frequency embodiment. However, in the asymmetrical intermediate frequency embodiment, $f_{IF\_PD}$ is referred to as a base intermediate frequency for predistortion. As such, in one embodiment, the minimum separation between the first and second intermediate frequencies is at or near two times the minimum intermediate frequency value ($f_{IF\_PD\_MIN}$) defined above. More specifically, as discussed above, in one embodiment, $f_{IF\_PD}$ is in the range of and including $f_{IF\_PD\_MIN}$ to $2f_{IF\_PD\_MIN}$, and as a result the separation between the first and second intermediate frequencies is in the range of an including $2f_{IF\_PD\_MIN}$ and $4f_{IF\_PD\_MIN}$. In another embodiment, $f_{IF\_PD}$ is in the range of and including $f_{IF\_PD\_MIN}$ plus a predefined guard band to assist in filtering. The minimum sampling rate for predistortion ($f_{S\_PD\_MIN}$) is also the same as defined above for the symmetrical intermediate frequency embodiment.

FIG. 24 illustrates a method of performing digital predistortion in a dual-band transmitter, such as but not limited to the dual-band transmitters 58 and 58', according to one embodiment of the present disclosure. As shown, a first baseband signal is up-sampled to a defined sampling rate to thereby provide a first up-sampled baseband signal (step 1000). In one embodiment, the defined sampling rate being at or near a minimum value determined based on a target intermodulation order, as discussed above. The first up-sampled baseband signal is tuned to a first intermediate frequency to provide a first intermediate frequency signal (step 1002). Likewise, a second baseband signal is up-sampled to the defined sampling rate to thereby provide a second up-sampled baseband signal (step 1004). The second up-sampled baseband signal is tuned to a second intermediate frequency to provide a second intermediate frequency signal (step 1006). Notably, steps 1000 and 1002 are performed concurrently to steps 1004 and 1006.

The first intermediate frequency signal and the second intermediate frequency signal are combined to provide a combined intermediate frequency signal (step 1008). Then, the combined intermediate frequency signal is predistorted to compensate for a non-linearity of a power amplifier in a transmit chain of the dual-band transmitter, thereby providing a predistorted signal (step 1010). From this point, the predistorted signal is up-converted and amplified for transmission as discussed above. As discussed above, in one embodiment, a separation between the first intermediate frequency and the second intermediate frequency is at or near a minimum separation value below which frequency bands in the predistorted signal for up to a target intermodulation order overlap frequency bands in the predistorted signal centered at the first and second intermediate frequencies.

Lastly, it should be noted that in one embodiment, both the sampling rate for predistortion and the separation between the first and second intermediate frequencies are minimized in the manner described above. However, the present disclosure is not limited thereto. In another embodiment, the sampling rate for predistortion may be minimized without minimizing the separation between the first and second intermediate frequencies in the manner described herein. In yet another embodiment, the separation between the first and second intermediate frequencies may be minimized without minimizing the sampling rate for predistortion in the manner described herein.

The following acronyms are used throughout this disclosure.

| | |
|---|---|
| IM3 | Third-Order Intermodulation Distortion |
| IM5 | Fifth-Order Intermodulation Distortion |
| LTE | Long Term Evolution (3GPP 4G technology) |
| PA | Power Amplifier |
| PD | Predistorter |

Those skilled in the art will recognize improvements and modifications to the preferred embodiments of the present disclosure. All such improvements and modifications are considered within the scope of the concepts disclosed herein and the claims that follow.

What is claimed is:

1. A system providing digital predistortion for a dual-band transmitter comprising:
   first tuning circuitry adapted to tune a first baseband signal to a first intermediate frequency to provide a first intermediate frequency signal;
   second tuning circuitry adapted to tune a second baseband signal to a second intermediate frequency to provide a second intermediate frequency signal;
   combiner circuitry adapted to combine the first intermediate frequency signal and the second intermediate frequency signal to provide a combined intermediate frequency signal; and
   predistortion circuitry adapted to predistort the combined intermediate frequency signal to compensate for a non-linearity of a power amplifier in a transmit chain of the dual-band transmitter, thereby providing a predistorted signal;
   wherein a separation between the first intermediate frequency and the second intermediate frequency is at or near a minimum separation value below which one or more frequency bands in the predistorted signal for up to a target intermodulation order overlap frequency bands in the predistorted signal centered at the first and second intermediate frequencies.

2. The system of claim 1 wherein the first intermediate frequency is a negative frequency, the second intermediate frequency is a positive frequency, and an absolute value of the first intermediate frequency is equal to an absolute value of the second intermediate frequency.

3. The system of claim 1 wherein the first intermediate frequency is a negative frequency, the second intermediate frequency is a positive frequency, and an absolute value of the first intermediate frequency is not equal to an absolute value of the second intermediate frequency.

4. The system of claim 1 wherein the first intermediate frequency and the second intermediate frequency are both of the same sign.

5. The system of claim 1 wherein the target intermodulation order is a $(2k+1)$th-order where k is an integer greater than or equal to 1, and the minimum separation value is two times a minimum intermediate frequency value, where the minimum intermediate frequency value is defined as:

$$f_{IF\_PD\_MIN} = \frac{1}{4}BW_1 + \frac{1}{4}BW_2 + k \cdot \max(BW_1, BW_2),$$

where $f_{IF\_PD\_MIN}$ is the minimum intermediate frequency value, $BW_1$ is a bandwidth of the first baseband signal, and $BW_2$ is a bandwidth of the second baseband signal.

6. The system of claim 5 wherein the separation between the first intermediate frequency and the second intermediate frequency is in a range of and including two times the minimum intermediate frequency value to four times the minimum intermediate frequency value.

7. The system of claim 5 wherein the separation between the first intermediate frequency and the second intermediate frequency is two times a sum of the minimum intermediate frequency value plus a predefined guard band.

8. The system of claim 5 wherein:
   the first intermediate frequency is a negative frequency, the second intermediate frequency is a positive frequency, and an absolute value of the first intermediate frequency is equal to an absolute value of the second intermediate frequency; and $$f_{IF\_PD\_MIN} \leq f_{IF\_PD} \leq 2f_{IF\_PD\_MIN},$$

where $-f_{IF\_PD}$ is the first intermediate frequency and $f_{IF\_PD}$ is the second intermediate frequency.

9. The system of claim 5 wherein:
   the first intermediate frequency is a negative frequency, the second intermediate frequency is a positive frequency, and an absolute value of the first intermediate frequency is equal to an absolute value of the second intermediate frequency; and
   the first and second intermediate frequencies are defined by:

$$f_{IF\_PD} = f_{IF\_PD\_MIN} + \text{guard}_{band},$$

where $-f_{IF\_PD}$ is the first intermediate frequency, $f_{IF\_PD}$ is the second intermediate frequency, and guard_band is a predefined guard band.

10. The system of claim 5 wherein:
    the first intermediate frequency, $f_{IF\_PD\_1}$, is $-f_{IF\_PD} + f_{IF\_PD\_OFFSET}$ and the second intermediate frequency, $f_{IF\_PD\_2}$, is $f_{IF\_PD} + f_{IF\_PD\_OFFSET}$ where $f_{IF\_PD}$ is a base intermediate frequency that is at or near the minimum intermediate frequency value and $f_{IF\_PD\_OFFSET}$ is a predefined frequency offset; and the base intermediate frequency is within a range of and including the minimum intermediate frequency value to two times the minimum intermediate frequency value.

11. The system of claim 5 wherein k=1 such that the target intermodulation order is a third-order intermodulation.

12. The system of claim 5 wherein k=2 such that the target intermodulation order is a fifth-order intermodulation.

13. The system of claim 5 wherein k=3 such that the target intermodulation order is a seventh-order intermodulation.

14. The system of claim 5 further comprising:

first up-sampling circuitry adapted to up-sample the first baseband signal to a defined sampling rate prior to tuning, the defined sampling rate being at or near a minimum sampling rate value determined based on the target intermodulation order; and second up-sampling circuitry adapted to up-sample the second baseband signal to the defined sampling rate prior to tuning to thereby provide a second up-sampled baseband signal.

15. The system of claim 14 wherein the minimum sampling rate value is a value below which frequency bands in the predistorted signal for up to the target intermodulation order alias into frequency bands in the predistorted signal centered at the first and second intermediate frequencies.

16. The system of claim 14 wherein:

the first intermediate frequency is a negative frequency, the second intermediate frequency is a positive frequency, and an absolute value of both the first intermediate frequency and the second intermediate frequency is at or near the minimum intermediate frequency value; and the minimum sampling rate value is defined as:

$$f_{S\_PD\_MIN} = (2k+2) \cdot f_{IF\_PD} + \left(\frac{k+1}{2}\right) BW_1 + \left(\frac{k+1}{2}\right) BW_2 + k \cdot \max(BW_1, BW_2),$$

where $f_{S\_PD\_MIN}$ is the minimum sampling rate value, $f_{IF\_PD}$ is the absolute value of both the first intermediate frequency and the second intermediate frequency, $BW_1$ is the bandwidth of the first baseband signal, and $BW_2$ is the bandwidth of the second baseband signal.

17. The system of claim 16 wherein the defined sampling rate is a sampling rate within a range of and including the minimum sampling rate value to two times the minimum sampling rate value.

18. The system of claim 17 wherein the absolute value of both the first intermediate frequency and the second intermediate frequency is within a range of and including the minimum intermediate frequency value to two times the minimum intermediate frequency value.

19. The system of claim 16 wherein k=1 such that the target intermodulation order is a third-order intermodulation.

20. The system of claim 16 wherein k=2 such that the target intermodulation order is a fifth-order intermodulation.

21. The system of claim 16 wherein k=3 such that the target intermodulation order is a seventh-order intermodulation.

22. The system of claim 14 wherein:

the first intermediate frequency, $f_{IF\_PD\_1}$, is $-IF_{PD} + f_{IF\_PD\_OFFSET}$ and the second intermediate frequency, $f_{IF\_PD\_2}$ is $f_{IF\_PD} + f_{IF\_PD\_OFFSET}$ where $f_{IF\_PD}$ is a base intermediate frequency that is at or near the minimum intermediate frequency value and $f_{IF\_PD\_OFFSET}$ is a predefined frequency offset; and the minimum sampling rate value is defined as:

$$f_{S\_PD\_MIN} = (2k+2) \cdot f_{IF\_PD} + \left(\frac{k+1}{2}\right) BW_1 + \left(\frac{k+1}{2}\right) BW_2 + k \cdot \max(BW_1, BW_2),$$

where $f_{S\_PD\_MIN}$ is the minimum sampling rate value, $BW_1$ is the bandwidth of the first baseband signal, and $BW_2$ is the bandwidth of the second baseband signal.

23. The system of claim 22 wherein the defined sampling rate is a sampling rate within a range of and including the minimum sampling rate value to two times the minimum sampling rate value.

24. The system of claim 23 wherein the base intermediate frequency is within a range of and including the minimum intermediate frequency value to two times the minimum intermediate frequency value.

25. The system of claim 22 wherein k=1 such that the target intermodulation order is a third-order intermodulation.

26. The system of claim 22 wherein k=2 such that the target intermodulation order is a fifth-order intermodulation.

27. The system of claim 22 wherein k=3 such that the target intermodulation order is a seventh-order intermodulation.

28. A method of providing digital predistortion for a dual-band transmitter comprising:

tuning a first baseband signal to a first intermediate frequency to provide a first intermediate frequency signal;

tuning a second baseband signal to a second intermediate frequency to provide a second intermediate frequency signal;

combining the first intermediate frequency signal and the second intermediate frequency signal to provide a combined intermediate frequency signal; and predistorting the combined intermediate frequency signal to compensate for a non-linearity of a power amplifier in a transmit chain of the dual-band transmitter, thereby providing a predistorted signal;

wherein a separation between the first intermediate frequency and the second intermediate frequency is at or near a minimum separation value below which frequency bands in the predistorted signal for up to a target intermodulation order overlap frequency bands in the predistorted signal centered at the first and second intermediate frequencies.

29. A system providing digital predistortion for a dual-band transmitter comprising:

first up-sampling circuitry adapted to up-sample a first baseband signal to a defined sampling rate to thereby provide a first up-sampled baseband signal, the defined sampling rate being at or near a minimum sampling rate value determined based on a target intermodulation order;

first tuning circuitry adapted to tune the first up-sampled baseband signal to a first intermediate frequency to provide a first intermediate frequency signal;

second up-sampling circuitry adapted to up-sample a second baseband signal to the defined sampling rate to thereby provide a second up-sampled baseband signal;

second tuning circuitry adapted to tune the second up-sampled baseband signal to a second intermediate frequency to provide a second intermediate frequency signal;

combiner circuitry adapted to combine the first intermediate frequency signal and the second intermediate frequency signal to provide a combined intermediate frequency signal; and predistortion circuitry adapted to predistort the combined intermediate frequency signal to compensate for a non-linearity of a power amplifier in a transmit chain of the dual-band transmitter, thereby providing a predistorted signal.

30. The system of claim 29 wherein the minimum sampling rate value is a value below which frequency bands in the predistorted signal for the target intermodulation order alias into frequency bands in the predistorted signal centered at the first and second intermediate frequencies.

31. The system of claim 29 wherein:
the first intermediate frequency is a negative frequency, the second intermediate frequency is a positive frequency, and an absolute value of both the first intermediate frequency is equal to an absolute value of the second intermediate frequency; and
the minimum sampling rate value is defined as:

$$f_{S\_PD\_MIN} = (2k+2) \cdot f_{IF\_PD} + \left(\frac{k+1}{2}\right)BW_1 + \left(\frac{k+1}{2}\right)BW_2 + k \cdot \max(BW_1, BW_2),$$

where $f_{S\_PD\_MIN}$ is the minimum sampling rate value, $f_{IF\_PD}$ is the absolute value of both the first intermediate frequency and the second intermediate frequency, $BW_1$ is a bandwidth of the first baseband signal, and $BW_2$ is a bandwidth of the second baseband signal.

32. The system of claim 31 wherein the defined sampling rate is a sampling rate within a range of and including the minimum sampling rate value to two times the minimum sampling rate value.

33. The system of claim 32 wherein the absolute value of both the first intermediate frequency and the second intermediate frequency is within a range of and including a minimum intermediate frequency value to two times the minimum intermediate frequency value.

34. The system of claim 31 wherein k=1 such that the target intermodulation order is a third-order intermodulation.

35. The system of claim 31 wherein k=2 such that the target intermodulation order is a fifth-order intermodulation.

36. The system of claim 31 wherein k=3 such that the target intermodulation order is a seventh-order intermodulation.

37. The system of claim 29 wherein:
the first intermediate frequency, $f_{IF\_PD\_1}$, is $-f_{IF\_PD} + f_{IF\_PD\_OFFSET}$ and the second intermediate frequency, $f_{IF\_PD\_2}$, is $f_{IF\_PD} + f_{IF\_PD\_OFFSET}$ where $f_{IF\_PD}$ is a base intermediate frequency and $f_{IF\_PD\_OFFSET}$ is a predefined frequency offset; and the minimum sampling rate value is defined as:

$$f_{S\_PD\_MIN} = (2k+2) \cdot f_{IF\_PD} + \left(\frac{k+1}{2}\right)BW_1 + \left(\frac{k+1}{2}\right)BW_2 + k \cdot \max(BW_1, BW_2),$$

where $f_{S\_PD\_MIN}$ is the minimum sampling rate value, $BW_1$ is a bandwidth of the first baseband signal, and $BW_2$ is a bandwidth of the second baseband signal.

38. The system of claim 37 wherein the defined sampling rate is a sampling rate within a range of and including the minimum sampling rate value to two times the minimum sampling rate value.

39. The system of claim 38 wherein the base intermediate frequency is within a range of and including a minimum intermediate frequency value to two times the minimum intermediate frequency value.

40. The system of claim 37 wherein k=1 such that the target intermodulation order is a third-order intermodulation.

41. The system of claim 37 wherein k=2 such that the target intermodulation order is a fifth-order intermodulation.

42. The system of claim 37 wherein k=3 such that the target intermodulation order is a seventh-order intermodulation.

43. A method of providing digital predistortion for a dual-band transmitter comprising:
up-sampling a first baseband signal to a defined sampling rate to thereby provide a first up-sampled baseband signal, the defined sampling rate being at or near a minimum value determined based on a target intermodulation order;
tuning the first up-sampled baseband signal to a first intermediate frequency to provide a first intermediate frequency signal;
up-sampling a second baseband signal to the defined sampling rate to thereby provide a second up-sampled baseband signal;
tuning the second up-sampled baseband signal to a second intermediate frequency to provide a second intermediate frequency signal;
combining the first intermediate frequency signal and the second intermediate frequency signal to provide a combined intermediate frequency signal; and
predistorting the combined intermediate frequency signal to compensate for a non-linearity of a power amplifier in a transmit chain of the dual-band transmitter, thereby providing a predistorted signal.

* * * * *

UNITED STATES PATENT AND TRADEMARK OFFICE
CERTIFICATE OF CORRECTION

PATENT NO. : 8,380,144 B1  
APPLICATION NO. : 13/249319  
DATED : February 19, 2013  
INVENTOR(S) : Bai et al.

Page 1 of 2

It is certified that error appears in the above-identified patent and that said Letters Patent is hereby corrected as shown below:

On the Title Page, in Item (56), under "OTHER PUBLICATIONS", in Column 2, Line 5, delete "MiMAX" and insert – WiMAX –, therefor.

In the Specification

In Column 4, Line 33, delete "($S_{ouT}$)," and insert - - ($S_{OUT}$), - -, therefor.

In Column 5, Line 40, delete "$f_{IF\_PD\_2}$" and insert - - $f_{IF\_PD\_2}$, - -, therefor.

In Column 6, Line 42, delete "DRAWING" and insert - - DRAWINGS/ - -, therefor.

In Column 8, Line 41, delete "an" and insert - - a - -, therefor.

In Column 9, Lines 1-24, delete "frequency bands. ............or the like)." and insert the same in Column 8, Line 67, after "second" as a continuation.

In Column 9, Line 44, delete "($S_{PD}$)" and insert - - ($S_{PD}$) - -, therefor.

In Column 11, Line 7, delete "($S_{FB1F2}$)." and insert - - ($S_{FB1\_F2}$). - -, therefor.

In Column 11, Line 49, delete "$f_{IF\_PD}$," and insert - - $f_{IF\_PD}$; - -, therefor.

In Column 12, Line 9, delete "90" and insert - - 90 - -, therefor.

In Column 12, Line 40, delete "($S_{FB\_BB1\_F}$)" and insert - - ($S_{FB\_BB1\_F}$) - -, therefor.

In Column 13, Line 16, delete "($f_{C1}$ and $f_{C1}$)." and insert - - ($f_{C1}$ and $f_{C2}$). - -, therefor.

In Column 13, Lines 23-33, delete "Specifically,...........follows:" and insert the same at Line 22, after "analysis." as a continuation.

In Column 13, Line 44, delete "($f_{D2}$)," and insert - - ($f_{C2}$), - -, therefor.

Signed and Sealed this  
Third Day of September, 2013

Teresa Stanek Rea  
*Acting Director of the United States Patent and Trademark Office*

CERTIFICATE OF CORRECTION (continued)
U.S. Pat. No. 8,380,144 B1

In Column 13, Line 48, in Equation (2), delete "$BW_{IM3\_B}=BW_2=BW_2+2\max(BW_1,BW_2);$" and insert -- $BW_{IM3\_B} = BW_2 + 2\max(BW_1, BW_2);$ --, therefor.

In Column 14, Line 43, delete "$BW_1>$" and insert -- $BW_1\geq$ --, therefor.

In Column 15, Line 2, delete "$-_{IF\_PD\_MIN}$" and insert -- $-f_{IF\_PD\_MIN}$ --, therefor.

In Column 16, Line 14, after Equation (14), insert -- . --.

In Column 16, Line 49, delete "($f_{C1}$ and $f_{C1}$)." and insert -- ($f_{C1}$ and $f_{C2}$). --, therefor.

In Column 17, Line 27, delete "$3f_{D1}-2f_{D2}$," and insert -- $3f_{C1}-2f_{C2}$, --, therefor.

In Column 17, Line 49, delete "$3_{IF\ PD}$," and insert -- $3f_{IF\_PD}$, --, therefor.

In Column 20, Line 14, in Equation (37), delete "$f_{S\_PD\_MIN}3BW_1+17BW_2.$" and insert -- $f_{S\_PD\_MIN} = 3BW_1 + 17BW_2.$ --, therefor.

In Column 20, Line 45, delete "$2f_{D2}-f_{C1}$," and insert -- $2f_{C2}-f_{C1}$, --, therefor.

In Column 21, Line 3, in Equation (40), delete "$BW_{IM(2k+1)\_(2l+2)}=$" and insert -- $BW_{IM(2k+1)\_(2l+2)}=$ --, therefor.

In Column 21, Line 11, delete "$4_{IF\_PD}$" and insert -- $-f_{IF\_PD}$ --, therefor.

In Column 21, Line 51, after "Equation (44)", insert -- . --.

In Column 23, Line 34, after "Equation (50)", insert -- . --.

In the Claims

In Column 26, Line 59, in Claim 9, delete "$f_{IF\_PD}=f_{IF\_PD\_MIN}+\text{guard}\_band,$" and insert -- $f_{IF\_PD} = f_{IF\_PD\_MIN} + guard\_band,$ --, therefor.

In Column 27, Line 62, in Claim 22, delete "$-IF_{PD}+$" and insert -- $-f_{IF\_PD}$ --, therefor.